US012693364B2

(12) United States Patent
Zhang et al.

(10) Patent No.: US 12,693,364 B2
(45) Date of Patent: Jul. 28, 2026

(54) SYSTEMS AND METHODS FOR REMOVING ELECTROMAGNETIC INTERFERENCE FROM MAGNETIC RESONANCE IMAGES

(71) Applicant: Hyperfine, Inc., Guilford, CT (US)

(72) Inventors: Dingtian Zhang, Branford, CT (US); Hadrien A. Dyvorne, New York City, NY (US); Deepansh Srivastava, New Haven, CT (US); Tianrui Luo, Guilford, CT (US); Laura Sacolick, Guilford, CT (US); Ian Vaughan Lyndon Clarkson, The Gap (AU); Troy Anthony Kilpatrick, Kedron (AU)

(73) Assignee: Hyperfine, Inc., Guilford, CT (US)

( * ) Notice: Subject to any disclaimer, the term of this patent is extended or adjusted under 35 U.S.C. 154(b) by 114 days.

(21) Appl. No.: 18/498,504

(22) Filed: Oct. 31, 2023

(65) Prior Publication Data

US 2025/0138124 A1 May 1, 2025

(51) Int. Cl.
*G01R 33/56* (2006.01)

(52) U.S. Cl.
CPC ................................ *G01R 33/5608* (2013.01)

(58) Field of Classification Search
CPC ............................ G01R 33/56; G01R 33/5608
See application file for complete search history.

(56) References Cited

U.S. PATENT DOCUMENTS

| | | | |
|---|---|---|---|
| 10,646,165 B2 * | 5/2020 | Krishnaswamy | ...... A61B 5/024 |
| 11,096,630 B2 * | 8/2021 | Speier | .................. A61B 5/7289 |
| 2024/0038368 A1 * | 2/2024 | Agarwal | .............. G06T 7/0012 |

FOREIGN PATENT DOCUMENTS

WO WO-2016/037028 A1 3/2016

* cited by examiner

*Primary Examiner* — Gregory H Curran
(74) *Attorney, Agent, or Firm* — Foley & Lardner LLP

(57) ABSTRACT

Systems and methods for removing electromagnetic interference (EMI) from magnetic resonance (MR) images are disclosed. The techniques described herein include receiving first signal data for an MR scan captured using a first coil of an MR system and second signal data captured using a second coil of the MR system. The techniques include generating a filter based at least on the first signal data and the second signal data. The techniques include generating filtered signal data using the filter, the first signal data, and the second signal data.

19 Claims, 10 Drawing Sheets

910 — RECEIVE FIRST SIGNAL DATA FOR AN MR SCAN CAPTURED USING A FIRST COIL OF AN MR SYSTEM AND SECOND SIGNAL DATA OF CAPTURE USING A SECOND COIL OF THE MR SYSTEM

920 — GENERATE A FILTER BASED AT LEAST ON THE FIRST SIGNAL DATA AND THE SECOND SIGNAL DATA

930 — GENERATE FILTERED SIGNAL DATA USING THE FILTER, THE FIRST SIGNAL DATA, AND THE SECOND SIGNAL DATA

SYSTEMS AND METHODS FOR REMOVING ELECTROMAGNETIC INTERFERENCE FROM MAGNETIC RESONANCE IMAGES

FIELD OF THE DISCLOSURE

The present invention relates generally to the field of interference removal from resonance (MR) imaging.

BACKGROUND

Magnet resonance imaging (MRI) systems are used to generate images of the inside of the human body. MRI systems may be used to detect magnetic resonance (MR) signals in response to applied electromagnetic fields. However, electromagnetic interference (EMI) experienced by the MRI systems can introduce issues such as loss of signal or images artifacts, an inability to calibrate system parameters, difficulty in combining signals from multiple imaging channels, and loss of signal, among others. It can be challenging to eliminate electromagnetic interference in MRI systems.

SUMMARY

The systems and methods of this technical solution provide techniques for mitigating the effects of electromagnetic interference (EMI) and/or other noise in MR systems by using a Kalman-like filtering process. By utilizing the techniques described herein, EMI in an imaging signal can be removed or suppressed, or otherwise reduced, while preserving properly captured MR images or MR signal data. The noise removal or reduction process can utilize both imaging and reference coils to capture image and noise data and can model the time-domain impulse response evolving from batch-to-batch with, for example, a Kalman filter or Kalman smoother. The techniques described herein provide improved performance with respect to both broadband and narrowband sources of EMI compared to conventional noise removal processes such as spectral-based noise suppression.

At least one aspect of the present disclosure is directed to a method of removing (used interchangeably with "reducing," "mitigating," or "compensating for") interference in MR systems. The method may be performed by an MR system including one or more processors. The method includes receiving first signal data for an MR scan captured using a first coil of an MR system and second signal data captured using a second coil of the MR system. The method includes generating a filter based at least on the first signal data and the second signal data. The method includes generating filtered signal data using the filter, the first signal data, and the second signal data.

In some implementations, the filter comprises a Kalman filter, a Kalman smoother, an extended Kalman filter, an unscented Kalman filter, or any other variations of Kalman filter. In some implementations, the first coil comprises an imaging coil and the second coil comprises a reference coil. In some implementations, the filter comprises one or more transfer functions between the second signal data and the first signal data. In some implementations, the method includes determining a state and a covariance for a current time step of the MR scan based at least on the first and the second signal data.

In some implementations, the method includes determining a state-to-measurement transition matrix based at least on the second signal data. In some implementations, generating the filtered signal data comprises subtracting estimated noise from the first signal data, the estimated noise determined using the filter and the state-to-measurement transition matrix. In some implementations, the first signal data and the second signal data correspond to a first timestep of the MR scan.

In some implementations, the method includes receiving third signal data for the MR scan captured using the first coil and fourth signal data captured using the second coil. In some implementations, the third signal data and the fourth signal data corresponding to a second timestep of the MR scan, the second timestep occurring before or after the first timestep. In some implementations, the method includes generating a second filter for the second timestep based at least on the filter, the third signal data, and the fourth signal data. In some implementations, the method includes generating second filtered signal data using the second filter and the third signal data.

In some implementations, generating the filter is further based on an estimated process noise covariance, and an estimated measurement noise covariance. In some implementations, generating the filter is further based on noise data generated using a third signal acquired by the MR system without MR signal, a fourth signal acquired by the MR system that has been modified to remove MR signal, or previous MR scan information.

At least one other aspect of the present disclosure is directed to a system for removing interference in MR systems. The system includes one or more processors. The system can receive first signal data for an MR scan captured using a first coil of an MR system and second signal data captured using a second coil of the MR system. The system can generate a filter based at least on the first signal data and the second signal data. The system can generate filtered signal data using the filter, the first signal data, and the second signal data.

In some implementations, the filter comprises a Kalman filter, a Kalman smoother, an extended Kalman filter, an unscented Kalman filter, or any other variations of Kalman filter. In some implementations, the first coil comprises an imaging coil and the second coil comprises a reference coil. In some implementations, the filter comprises one or more transfer functions between the second signal data and the first signal data. In some implementations, the system can determine a state and a covariance for a current time step of the MR scan based on the first and the second signal data.

In some implementations, the system can determine a state-to-measurement transition matrix based on the second signal data. In some implementations, the system can generate the filtered signal data by performing operations comprising subtracting estimated noise from the first signal data, the estimated noise determined using the filter and the state-to-measurement transition matrix. In some implementations, the first signal data and the second signal data correspond to a first timestep of the MR scan.

In some implementations, the system can receive third signal data for the MR scan captured using the first coil and fourth signal data captured using the second coil. In some implementations, the third signal data and the fourth signal data corresponding to a second timestep of the MR scan, the second timestep occurring before or after the first timestep. In some implementations, the system can generate a second filter for the second timestep based at least on the filter, the third signal data, and the fourth signal data. In some implementations, the system can generate second filtered signal data using the second filter and the third signal data.

In some implementations, the system can generate the filter further based on an estimated process noise covariance and an estimated measurement noise covariance. In some implementations, the system can generate the filter further based on noise data generated using a third signal acquired by the MR system without MR signal, a fourth signal acquired by the MR system that has been modified to remove MR signal, or previous MR scan information.

Yet another aspect of the present disclosure is directed to a method of removing interference in MR systems. The method includes generating a model to characterize an imaging channel and a reference channel such that EMI exists on both the imaging channel and the reference channel, and an MR signal exists only on the imaging channel. The method includes modeling time-domain impulse response evolving from batch-to-batch with an oth order Kalman filter or smoother. The method includes removing modeled EMI from the imaging channel to denoise the MR signal.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects may be combined and it will be readily appreciated that features described in the context of one aspect of the present disclosure may be combined with other aspects. Aspects may be implemented in any convenient form. In a non-limiting example, by appropriate computer programs, which may be carried on appropriate carrier media (computer readable media), which may be tangible carrier media (e.g. disks) or intangible carrier media (e.g. communications signals). Aspects may also be implemented using suitable apparatus, which may take the form of programmable computers running computer programs arranged to implement the aspect. As used in the specification and in the claims, the singular form of "a," "an," and "the" include plural referents unless the context clearly dictates otherwise.

BRIEF DESCRIPTION OF THE DRAWINGS

FIGS. 8A, 8B, and 8C show comparison images of spectral-based noise removal, noise removal according to the techniques described herein performed sample-by-sample, and noise removal according to the techniques described herein performed batch-by-batch, respectively, in accordance with one or more implementations;

DETAILED DESCRIPTION

Figure 1:
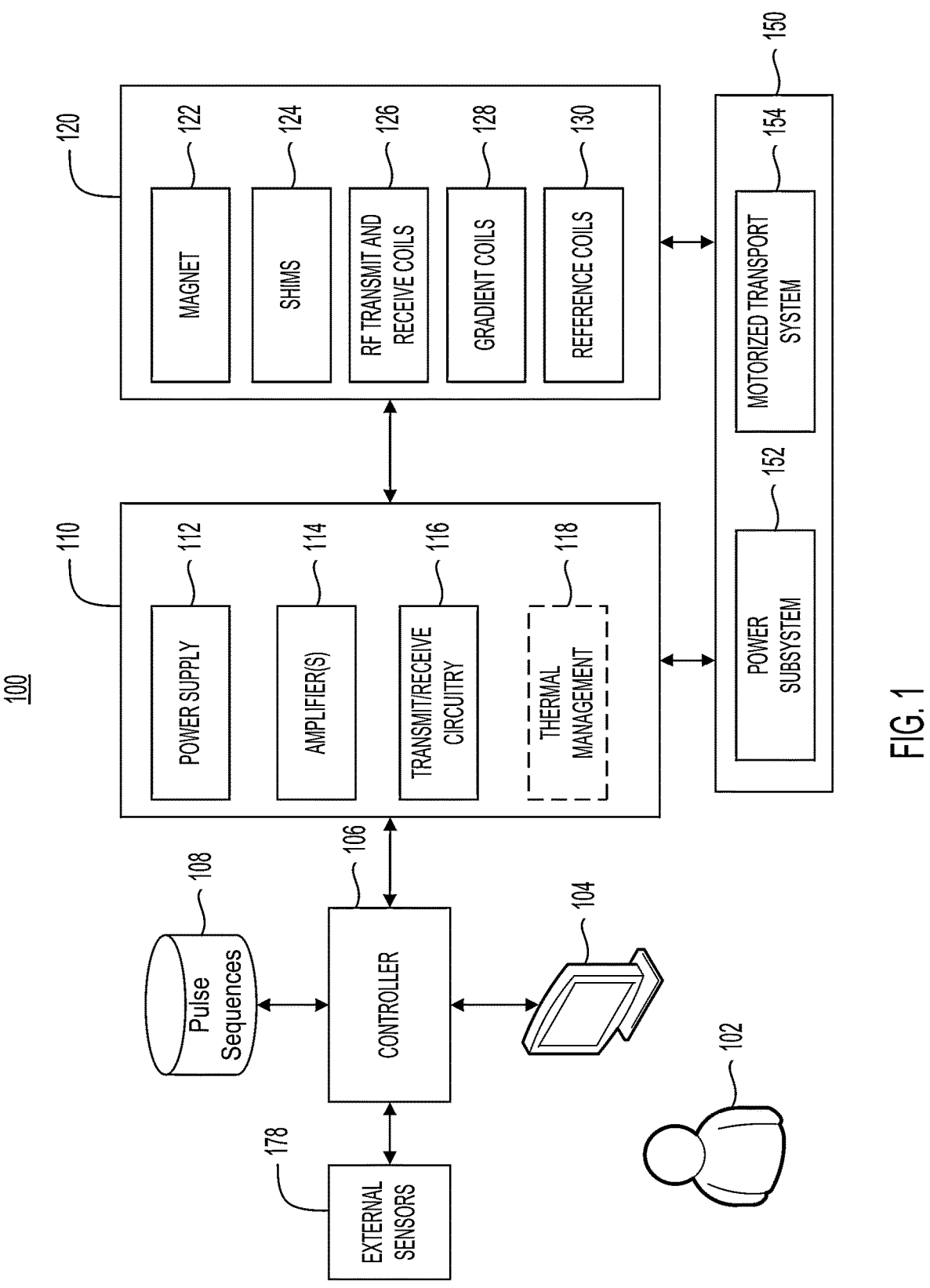
FIG. 1 illustrates example components of a magnetic resonance imaging system, which may be utilized to implement the techniques to remove electromagnetic interference from magnetic resonance images or magnetic resonance signal data, in accordance with one or more implementations.

Below are detailed descriptions of various concepts related to and implementations of techniques, approaches, methods, apparatuses, and systems for removing electromagnetic interference from magnetic resonance images. The various concepts introduced above and discussed in detail below may be implemented in any of numerous ways, as the described concepts are not limited to any particular manner of implementation. Examples of specific implementations and applications are provided primarily for illustrative purposes.

Magnetic resonance imaging (MRI) systems use magnetic fields and electromagnetic signals to create detailed internal images of a patient in a non-invasive manner. In MR imaging, a magnetic field is applied to temporarily align protons in the patient, and one or more radiofrequency pulses are transmitted through the patient, which stimulate the protons and cause them to spin out of equilibrium. As the protons return to their original positions, they transmit radio signals that are detected by corresponding receive coils of the MRI systems. The received signals encode information about the structure and delineation of different tissues within the patient and can be used to reconstruct two-dimensional (2D) or three-dimensional (3D) internal images using image reconstruction techniques.

The radiofrequency signals returned from the patient have low power, and therefore are susceptible to electromagnetic interference from the environment. These effects may be more pronounced in MRI systems that have weaker magnetic fields, such as low-field MRI systems. Low-field MRI systems are MRI systems that can operate with a lower magnetic field strength than conventional MRI systems. Low-field MRI systems may include portable MRI systems, which may have a field strength that may be, in a non-limiting example, less than or equal to 0.5 T.

Electromagnetic interference can affect the quality of MR images. Electromagnetic interference can be visible in images as narrowband, or broadband noise artifacts. Interference may also make MRI system calibrations more difficult or unreliable. In a non-limiting example, interference noise may make it difficult to find signal resonance frequency, calibrate RF power transmission, or find field shimming parameters. Noise may also interfere with ability to reconstruct images or perform image corrections, for example by causing artifacts in receive coil sensitivity maps, navigator signals, or data used for image motion correction. Sources of EMI may include external radiofrequency signals from, for example, external systems such as power systems, cell phones or mobile devices, or other electronic equipment, may include internal radiofrequency signals from scanner electronics, or may include radiofrequency signals from electronics used in patient care such as monitoring devices or ventilators. Low-field, portable MR systems may be particularly susceptible to MR noise, because they may be operated in changing environments where electromagnetic interference is more common or abundant.

The systems and methods described herein provide techniques for removing EMI from MR scan data using Kalman filter-based techniques. As described in further detail herein, the Kalman filter-based techniques are generally applicable to remove both narrowband and broadband EMI noise. The techniques are generally applicable to increasing overall Signal to Noise ratio (SNR) and decreasing artifacts in any signal acquired by an MRI scanner, including for all types of imaging sequences, as well as for acquiring data used for calibrations, image corrections, and testing. Conventional approaches, such as spectral-based noise suppression, are unsuitable for broadband noise, and only have limited effectiveness in removing narrowband EMI. The techniques described herein therefore improve upon conventional noise removal approaches in MRI systems.

FIG. 1 illustrates an example MRI system which may be utilized in connection with the Kalman filter-based EMI removal techniques described herein. In FIG. 1, MRI system 100 may include a computing device 104, a controller 106, a pulse sequences repository 108, a power management system 110, and magnetics components 120. The MRI system 100 is illustrative, and an MRI system may have one or more other components of any suitable type in addition to or instead of the components illustrated in FIG. 1. Additionally, the implementation of components for a particular MRI system may differ from those described herein. Non-limiting examples of low-field MRI systems may include portable MRI systems, which may have a field strength that may be, in a non-limiting example, less than or equal to 1.5 T, less than or equal to 0.5 T, that may be less than or equal to 0.2 T, that may be within a range from 1 mT to 100 mT, that may be within a range from 50 mT to 0.1 T, that may be within a range of 40 mT to 80 mT, that may be about 64 mT, etc.

The magnetics components 120 may include $B_0$ magnets 122, shims 124, RF transmit and receive coils 126, and gradient coils 128. The $B_0$ magnets 122 may be used to generate a main magnetic field $B_0$. $B_0$ magnets 122 may be any suitable type or combination of magnetics components that may generate a desired main magnetic $B_0$ field. In some embodiments, $B_0$ magnets 122 may be one or more permanent magnets, one or more electromagnets, one or more superconducting magnets, or a hybrid magnet comprising one or more permanent magnets and one or more electromagnets or one or more superconducting magnets. In some embodiments, $B_0$ magnets 122 may be configured to generate a $B_0$ magnetic field having a field strength that may be less than or equal to 0.2 T or within a range from 50 mT to 0.1 T.

In some implementations, the $B_0$ magnets 122 may include a first and second $B_0$ magnet, which may each include permanent magnet blocks arranged in concentric rings about a common center. The first and second $B_0$ magnet may be arranged in a bi-planar configuration such that the imaging region is located between the first and second $B_0$ magnets. In some embodiments, the first and second $B_0$ magnets may each be coupled to and supported by a ferromagnetic yoke configured to capture and direct magnetic flux from the first and second $B_0$ magnets.

The gradient coils 128 may be arranged to provide gradient fields and, in a non-limiting example, may be arranged to generate gradients in the $B_0$ field in three substantially orthogonal directions (X, Y, and Z). Gradient coils 128 may be configured to encode emitted MR signal by systematically varying the $B_0$ field (the $B_0$ field generated by the $B_0$ magnets 122 or shims 124) to encode the spatial location of received MR signal as a function of frequency or phase. In a non-limiting example, the gradient coils 128 may be configured to vary frequency or phase as a linear function of spatial location along a particular direction, although more complex spatial encoding profiles may also be provided by using nonlinear gradient coils. In some embodiments, the gradient coils 128 may be implemented using laminate panels (e.g., printed circuit boards), in a non-limiting example. Note that while substantially orthogonal gradient coils are described as an example, the techniques described herein can utilize any orientation or method of spatially encoding MR signal.

MRI scans are performed by exciting and detecting emitted MR signal using transmit and receive coils 126, respectively (referred to herein as radio frequency (RF) coils). The transmit and receive coils 126 include separate coils for transmitting and receiving, multiple coils for transmitting or receiving, or the same coils for transmitting and receiving. Thus, a transmit/receive component may include one or more coils for transmitting, one or more coils for receiving, or one or more coils for transmitting and receiving. The transmit/receive coils may be referred to as Tx/Rx or Tx/Rx coils to generically refer to the various configurations for transmit and receive magnetics components of an MRI system. These terms are used interchangeably herein. In FIG. 1, RF transmit and receive coils 126 may include one or more transmit coils that may be used to generate RF pulses to induce an oscillating magnetic field $B_1$. The transmit coil(s) may be configured to generate any type of suitable RF pulses.

Reference coils 130 may also be operated in connection with the transmit and receive coils 126 to capture the electromagnetic noise of the environment without capturing MR signal data. In particular, the reference coils 130 may be positioned in or near the MR system 100 such that, during an MR scan, the reference coils 130 do not receive signals including MR image data, and instead only receive and/or capture electromagnetic interference emitted within the environment in which the scan is being performed. In contrast, the receive coil(s) of the MR system can capture both MR signal data emitted via the patient as well as electromagnetic interference from the environment. Signal data captured via the reference coils 130 may be stored (e.g., by the controller 106, the computer 104, etc.) in computer storage in association with corresponding signal data captured via the transmit and receive coils 126. The signal data captured via the reference coils 130 may be utilized in connection with the Kalman filter-based noise removal approaches to remove electromagnetic interference from the signals captured via the transmit and receive coils 126, as described herein. As used herein, signals that include both imaging and noise data (e.g., captured via the transmit and receive coils 126) may be referred to as "image channels," "imaging channels," "MR signal channels," or "signal channels," while signals that include only noise data (e.g., captured via the reference coils 130) may be referred to as "reference channels."

The power management system 110 includes electronics to provide operating power to one or more components of the MRI system 100. In a non-limiting example, the power management system 110 may include one or more power supplies, energy storage devices, gradient power components, transmit coil components, or any other suitable power electronics needed to provide suitable operating power to energize and operate components of MRI system 100. As illustrated in FIG. 1, the power management system 110 may include a power supply system 112, power component(s) 114, transmit/receive circuitry 116, and may optionally include thermal management components 118 (e.g., cryogenic cooling equipment for superconducting magnets, water cooling equipment for electromagnets).

The power supply system 112 may include electronics that provide operating power to magnetic components 120 of the MRI system 100. The electronics of the power supply system 112 may provide, in a non-limiting example, operating power to one or more gradient coils (e.g., gradient coils 128) to generate one or more gradient magnetic fields to provide spatial encoding of the MR signal. Additionally, the electronics of the power supply system 112 may provide operating power to one or more RF coils (e.g., RF transmit and receive coils 126, the reference coils 130) to generate or receive one or more RF signals from the subject or EMI signals from the environment.

In a non-limiting example, the power supply system 112 may include a power supply configured to provide power from mains electricity to the MRI system or an energy storage device. The power supply may, in some embodiments, be an AC-to-DC power supply that converts AC power from mains electricity into DC power for use by the MRI system. The energy storage device may, in some embodiments, be any one of a battery, a capacitor, an ultracapacitor, a flywheel, or any other suitable energy storage apparatus that may bi-directionally receive (e.g., store) power from mains electricity and supply power to the MRI system. Additionally, the power supply system 112 may include additional power electronics including, but not limited to, power converters, switches, buses, drivers, and any other suitable electronics for supplying the MRI system with power.

The amplifiers(s) 114 may include one or more RF receive (Rx) pre-amplifiers that amplify MR signal detected by one or more RF receive coils (e.g., coils 126, the reference coils 130), one or more RF transmit (Tx) power components configured to provide power to one or more RF transmit coils (e.g., coils 126), one or more gradient power components configured to provide power to one or more gradient coils (e.g., gradient coils 128), and may provide power to one or more shim power components configured to provide power to one or more shims (e.g., shims 124). In some implementations, the shims 124 may be implemented using permanent magnets, electromagnetics (e.g., a coil), or combinations thereof. The transmit/receive circuitry 116 may be used to select whether RF transmit coils or RF receive coils and the reference coils 130 are being operated.

As illustrated in FIG. 1, the MRI system 100 may include one or more controllers 106 (also referred to as a console), which may include control electronics to send instructions to and receive information from power management system 110. The controller 106 may be configured to implement one or more pulse sequences, which are used to determine the instructions sent to power management system 110 to operate the magnetic components 120 in a desired sequence (e.g., parameters for operating the RF transmit and receive coils 126, parameters for operating gradient coils 128, parameters for operating the reference coils 130, etc.). Additionally, the controller 106 may execute processes to remove electromagnetic interference from magnetic resonance images according to various techniques described herein. A pulse sequence may generally describe the order and timing in which the RF transmit and receive coils 126 and the gradient coils 128 operate to acquire resulting MR data. In a non-limiting example, a pulse sequence may indicate an order and duration of transmit pulses, gradient pulses, and acquisition times during which the receive coils acquire MR data.

A pulse sequence (e.g., stored in the pulse sequence repository 108) may be organized into a series of periods. In a non-limiting example, a pulse sequence may include a pre-programmed number of pulse repetition periods, and applying a pulse sequence may include operating the MRI system in accordance with parameters of the pulse sequence for the pre-programmed number of pulse repetition periods. In each period, the pulse sequence may include parameters for generating RF pulses (e.g., parameters identifying transmit duration, waveform, amplitude, phase, etc.), parameters for generating gradient fields (e.g., parameters identifying transmit duration, waveform, amplitude, phase, etc.), timing parameters governing when RF or gradient pulses are generated or when the receive coil(s) are configured to detect MR signal generated by the subject and the reference coil(s) 130 are configured to detect electromagnetic signals from the environment, among other functionality.

Examples of pulse sequences include but are not limited to zero or ultra-short echo time (ZTE, UTE) pulse sequences, free induction decay pulse sequences, steady-state pulse sequences, gradient echo pulse sequences, inversion recovery pulse sequences, echo-planar pulse sequences, spin echo pulse sequences including conventional spin echo (CSE) pulse sequences, multi-shot fast-spin echo (FSE) pulse sequences, turbo spin echo (TSE) pulse sequences or any multi-spin echo pulse sequences such a diffusion weighted spin echo pulse sequences, inversion recovery spin echo pulse sequences, arterial spin labeling pulse sequences, spectroscopy or spectroscopic imaging sequences, and Overhauser imaging pulse sequences, among others.

Once imaging channels from the receive coil(s) 126 and reference channels from the reference coils 130 have been received (e.g., after an MR scan has been completed or during an MR scan), the controller 106 can implement a Kalman filter-based noise removal process, as described in further detail herein. The Kalman filter-based noise removal process may operate by first establishing a model that characterizes the imaging channels with the reference channels of incoming sensor measurement data (e.g., retrieved from memory after an MR scan or captured during an MR scan), assuming EMI as "signal" that exists on both imaging and reference channels and MRI signal as additive independent "noise" that exists only on imaging channels. The controller can then model the time-domain impulse response evolving from batch-to-batch (or from sample-to-sample, in some implementations) with an oth order Kalman filter or smoother. The Kalman filter may be or include any of a Kalman filter, a Kalman smoother, an extended Kalman filter, an unscented Kalman filter, or any other variations of Kalman filters. The modeled EMI can then be removed from the imaging channels, which would leave only denoised MRI signal data.

The controller 106 can perform the Kalman filter-based EMI removal process on a batch-by-batch basis. In some implementations, the controller may perform a smoothing operation. In a non-limiting example, the smoothing operation may be performed after all MR data has been acquired for a scan. Furthering this non-limiting example, the controller may utilize a Bryson-Frazier smoother, starting from the last datapoint, to correct the filter prediction backward using an estimate is determined according to the saved state and covariance from the Kalman filter. In some implementations, the Kalman filter or smoother may be utilized as a sparse block tridiagonal system, which uses pre-scan noise data to correct packets of MR scan data captured "on the fly" in online image reconstruction (e.g., during an MR scan). The controller 106 may then perform an image reconstruction process using the filtered signal data (e.g., k-space data), and/or communicate the filtered signal data) to the computing device 104 for processing.

As illustrated in FIG. 1, the controller 106 may communicate with the computing device 104, which may be programmed to process received MR data (e.g., the filtered signal data). In a non-limiting example, the computing device 104 may process received MR data to generate one or more MR images using any suitable image reconstruction processes. Additionally or alternatively, the controller 106 may process received MR data to perform image reconstruction, and the reconstructed image may be provided to the computing device 104 for display. Additionally or alternatively, the controller may process received MR data to perform calibrations, testing, or corrections that may be used in acquiring or reconstructing MR images. The controller 106 may provide information about one or more pulse sequences to computing device 104 for the processing of data by the computing device.

The computing device 104 may be any electronic device configured to process acquired MR data and generate one or more images of a subject being imaged. The computing device 104 may include at least one processor and a memory (e.g., a processing circuit). The memory may store processor-executable instructions that, when executed by a processor, cause the processor to perform one or more of the operations described herein. The processor may include a microprocessor, an application-specific integrated circuit (ASIC), a field-programmable gate array (FPGA), a graphics processing unit (GPU), a tensor processing unity (TPU), etc., or combinations thereof. The memory may include, but is not limited to, electronic, optical, magnetic, or any other storage or transmission device capable of providing the processor with program instructions. The memory may further include a floppy disk, CD-ROM, DVD, magnetic disk, memory chip, ASIC, FPGA, read-only memory (ROM), random-access memory (RAM), electrically erasable programmable ROM (EEPROM), erasable programmable ROM (EPROM), flash memory, optical media, or any other suitable memory from which the processor may read instructions. The instructions may include code generated from any suitable computer programming language. The computing device 104 may include any or all of the components and perform any or all of the functions of the computer system 1000 described in connection with FIG. 10. In some implementations, the computing device 104 may be located in a same room as the MRI system 100 or coupled to the MRI system 100 via wired or wireless connection.

In some implementations, computing device 104 may be a fixed electronic device such as a desktop computer, a server, a rack-mounted computer, or any other suitable fixed electronic device that may be configured to process MR data and generate one or more images from MR signal captured using the MRI system 100. Alternatively, computing device 104 may be a portable device such as a smart phone, a personal digital assistant, a laptop computer, a tablet computer, or any other portable device that may be configured to process MR signal data (e.g., perform image reconstruction, other processing operations, etc.). In some implementations, computing device 104 may comprise multiple computing devices of any suitable type, as aspects of the disclosure provided herein are not limited in this respect. In some implementations, operations that are described as being performed by the computing device 104 may instead be performed by the controller 106, or vice-versa. In some implementations, certain operations may be performed by both the controller 106 and the computing device 104 via communications between said devices.

The MRI system 100 may include one or more external sensors 178. The one or more external sensors may assist in detecting one or more error sources (e.g., motion, noise) which degrade image quality. The controller 106 may be configured to receive information from the one or more external sensors 178. In some embodiments, the controller 106 of the MRI system 100 may be configured to control operations of the one or more external sensors 178, as well as collect information from the one or more external sensors 178. The data collected from the one or more external sensors 178 may be stored in a suitable computer memory and may be utilized to assist with various processing operations of the MRI system 100.

The MRI system 100 may be a portable MRI system, and therefore may include portable subsystems 150. The portable subsystems 150 may include at least one power subsystem 152 and at least one motorized transport system 154. The power subsystem 152 may include any device or system that enables or supports the portability of the MRI system 100. In a non-limiting example, the power subsystem 152 may include any of the functionality of the power supply 112, and may further include other circuitry enabling the provision of electric power, including but not limited to as batteries and associated circuitry, AC-DC converters, DC-DC converters, switching power converters, voltage regulators, or battery charging circuitry, among others. The power subsystem 152 may include connectors that support the portability of the MRI system 100, such as connectors and cables of a suitable size for a portable system. In some implementations, the power subsystem 152 may include circuitry that provides power to the MRI system 100. In some implementations, the power subsystem 152 may include circuitry or connectors that enable the MRI system 100 to receive power from one or more power outlets, which may include standard power outlets.

The motorized transport system 154 can include any device or system that allows the MRI system 100 to be transported to different locations. The motorized transport system 154 may include one or more components configured to facilitate movement of the MRI system 100 to a location at which MRI is needed. In some implementations, the motorized transport system 154 may include a motor coupled to drive wheels. In such implementations, the motorized transport system 154 may provide motorized assistance in transporting MRI system 100 to one or more locations. The motorized transport system 154 may include a plurality of castors to assist with support and stability as well as facilitating transport.

In some implementations, the motorized transport system 154 includes motorized assistance controlled using a controller (e.g., a joystick or other controller that can be manipulated by a person) to guide the portable MRI system during transportation to desired locations. The motorized transport system 154 may include power assist circuitry (e.g., including accelerometers and vibration sensors, etc.)

that detects when force is applied to the MRI system and, in response, engages the motorized transport system 154 to provide motorized assistance in the direction of the detected force. In some implementations, the motorized transport system 154 can detect when force is applied to one or more portions of the MRI system 100 (e.g., by an operator pushing on or applying force to a rail, housing, etc., of the MRI system 100) and, in response, provide motorized assistance to drive the wheels in the direction of the applied force. The MRI system 100 can therefore be guided to locations where MRI is needed. The power subsystem 152 can be utilized to provide power to the MRI system 100, including the motorized transport system 154.

In some implementations, the motorized transport system 154 may include a safety mechanism that detects collisions. In a non-limiting example, the motorized transport system 154 can include one or more sensors that detect the force of contact with another object (e.g., a wall, bed, or other structure). Upon detection of a collision, the motorized transport system 154 can generate a signal to one or more motors or actuators of the motorized transport system 154, to cause a motorized locomotion response away from the source of the collision. In some implementations, the MRI system 100 may be transported by having personnel move the system to desired locations using manual force. In such implementations, the motorized transport system 154 may include wheels, bearings, or other mechanical devices that enable the MRI system 100 to be repositioned using manual force.

As described herein, the controller 106 may include one or more processors and memory, and may include any or all of the components and perform any or all of the functions of the computer system 1000 described in connection with FIG. 10. The controller 106 may control one or more of the components of the MRI system 100 to perform an MR scan and the Kalman filter-based noise removal techniques described herein.

In addition, theory relating to the process of performing EMI noise removal processes are provided. As described herein, signal data captured using the receive coil(s) 126 can store both EMI signal data and MR image signal data, while the signal data captured using the reference data can store only the EMI signal data. Because the reference coils 130 and the receive coil(s) 126 are operated at the same time during the scan, both coils should carry signal data that approximates EMI experienced by the MR system 100.

For the following non-limiting example explanation, $N_k$ represents the discrete-time complex-baseband MRI signal at a given time step (batch or sample) k. For the analysis, the MRI signal can be regarded as additive, independent Gaussian "noise" in the imaging channels. The data structure $Y_k$ represents sensor measurements. The values $Y_{im,k}$ and $Y_{ref,k}$ are used to represent the imaging channels and the reference channels, respectively. The signal data of the imaging channels is represented by $Y_{im,k}$ and the signal data of the reference channels by $Y_{ref,k}$ and the Fourier Transforms (FTs) $y_{im}[k]$ and $y_{ref}[k]$.

The imaging noise variance depends on r and l but not on c. The Fourier Transform (FT) of a signal is represented as $y[k]=F\{Y_k\}$. The baseline model (e.g., the spectral-based approach) assumes that:

$$y_{im}[k]=h_{ref,im}[k]y_{ref}[k]+\eta_{im}[k]$$

In the above equation, the matrices $h_{ref,im}[k]$ represent the mixing coefficients, and $\eta_{im}[k]=F\{N_{im,k}\}$ is the frequency-domain "noise" in the imaging channels (e.g., the signal carrying the MRI image data). Converting to the time domain, the baseline model is that, in imaging channel i, $$Y_{im,k}=\Sigma_{r\in ref,i\in im}H_{r,i,k}*Y_{r,k}+N_{im,k}$$

In the above equation, $H_{r,i,k}$ is the impulse response of a time-domain filter connecting reference channel r to imaging channel i.

The Kalman filter-based techniques described herein, rather than estimating the filter impulse responses in each block, instead model the impulse response evolving over time using a Kalman filter approach, as described in further detail in connection with FIG. 2. In the description of the Kalman-filter based techniques described herein, the notation $H_{r,i,k}$ represents the state of the system at time step k, connecting reference channel r to imaging channel i. For an oth-order filter, the state may have dimensions $n_{im}\times n_{ref}\times(o+1)$ where $n_{im}$ is the number of imaging channels and $n_{ref}$ is the number of reference channels.

The order of Kalman filter, o, can denote the maximum delay in batches (e.g., lines, samples, etc.) used in computing each output (e.g., filtered portions of MR scans). A higher order can potentially increase the interference removal performance by compensating for delays in the system, up to a point when the Kalman filter "overfits" the data in imaging channels, where MR signal are being targeted and removed. In some implementations, the filter order o is set to 8. However, it should be understood that the order may be any suitable value chosen to avoid overfitting and satisfy computational requirements.

Figure 2:
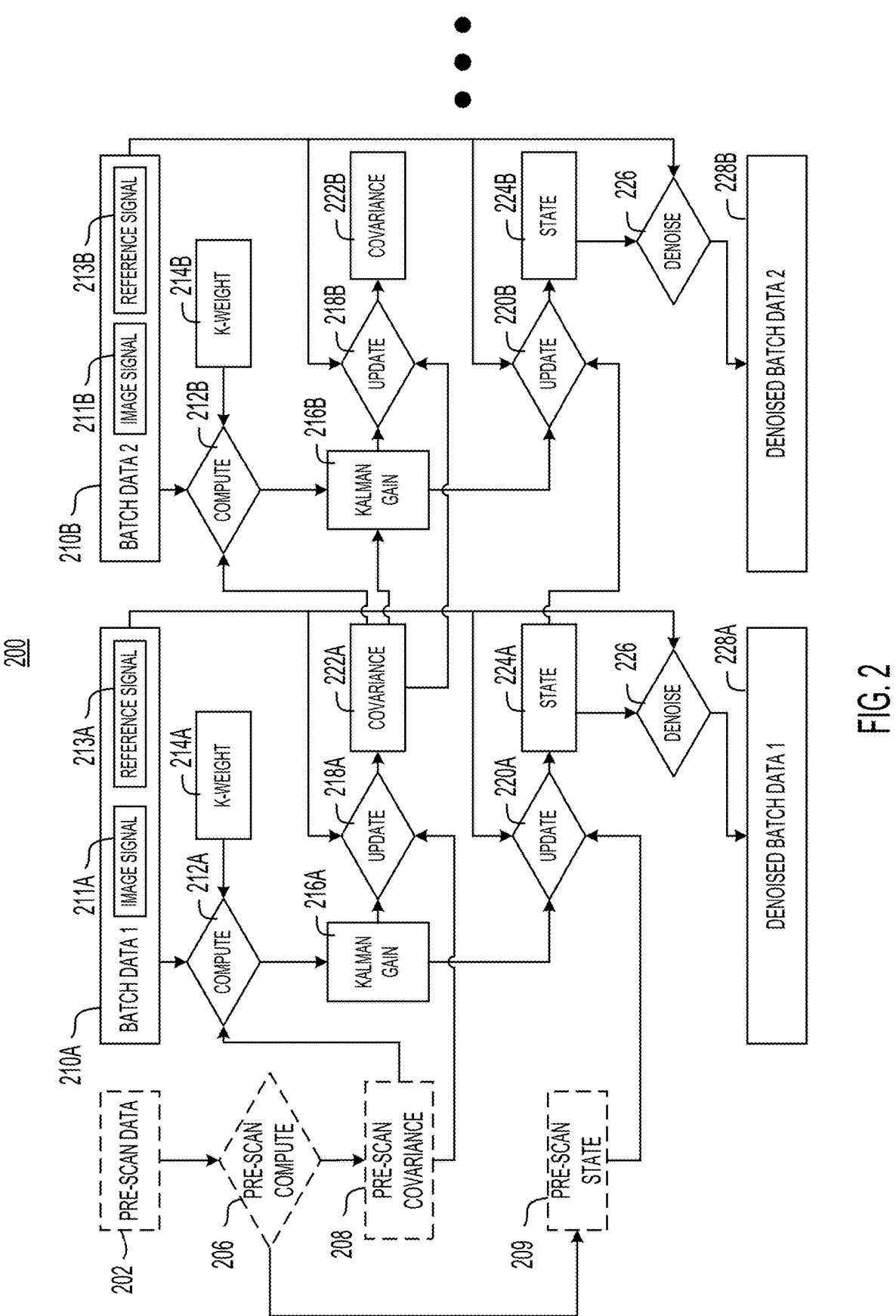
FIG. 2 illustrates an example dataflow diagram showing a batch-to-batch application of Kalman filter to remove EMI from an MR scan, in accordance with one or more implementations.

Referring to FIG. 2, illustrated is an example dataflow diagram 200 showing the batch-to-batch application of Kalman filter to remove EMI from an MR scan, in accordance with one or more implementations. As shown, the Kalman filter approach is applied iteratively across the batches 210A-210B of MRI scan data, which include image signal data 211A-211B (generally referred to as the image signal data 211), and reference signal data 213A-213B (generally referred to as the reference signal data 213), respectively. The image signal data 211 can be captured by the receive coils 126, and can include MRI imaging information and noise data, and the reference signal data can include only the noise data from the environment during the scan. Each of the batch data 210A-210B can be corresponding batches of k-space data captured during an MR scan. In some implementations, the Kalman filter approach shown in FIG. 2 is performed during the MR scan, e.g., as batches of k-space data are captured. In some implementations, the Kalman filter approach shown in FIG. 2 is performed after the MR scan is complete, e.g., in a post-acquisition processing stage. Note that while the increment of data here is described as a "batch" of data, information processed using the techniques described herein may be any suitable division of the data captured by the MR system into increments. Data may be divided into increments of a single sample, a single (readout) line, multiple lines, sub-divisions of single lines, or may be divided into a variable division size.

The Kalman filter process may include at least two steps: a prediction step, where the next state of the system is predicted given the previous measurements, and the update step, where the current state of the system is estimated given the measurement at that time step. The inference correction process is shown in the dataflow diagram 200. Although only two batches 210A-210B of MR data are shown in FIG. 2, it should be understood that the filtering process described herein may be applied to any number of batches of MR data, with the outputs produced by processing the second batch

210B being provided as input to a processing stage of a third batch, in a non-limiting example.

The following examples are described such that the batch data 210A corresponds to a timestep k for which processing is performed. In some implementations, padding may be added to the batch data 210A to improve the performance of the interference removal process. As the Kalman filter updating the state and covariance matrices based on the incoming data, discontinuity of sampling, such as larger time gaps between data chunks (e.g. readout lines), may lead to greater uncertainty of the system state. Filling in the missing data at the beginning and the end of readout lines (referred to "padding"), which matches the Kalman filter order, improves the interference removal performance at the edge of K-space, in a non-limiting example. In some implementations, symmetric padding may be added at the beginning of each batch 210A-210B (e.g., mirror of the first o elements) to avoid introducing new information to the system (e.g. compared to zero padding that introduces DC and high-frequency component).

When processing the batch 210A of MR data, the compute process 212A can perform a prediction calculation to calculate a predicted state, represented as $H'_k$, and a predicted covariance, represented as $P'_k$. To calculate the predicted state and the predicted covariance, the MR system can compute the following equations:

$$H'_k = H_{k-1}$$
$$P'_k = P_{k-1} + Q_{k-1}$$

In the above equations, and further equations described herein, $Q_k$ is the estimated process noise covariance on time step k (e.g., the timestep corresponding to the batch 210A), $H_k$ and $P_k$ are the estimated (a posteriori) state and covariance, respectively, on time step k after seeing the measurement. As such, $H_{k-1}$ and $P_{k-1}$ are the estimated state and covariance, respectively, of time step k−1 (e.g., calculated from the previous batch).

The estimated process noise covariance, Q, may account for inaccuracy in the system model. As such, the greater the value of Q, the greater the confidence in the model prediction over actual measurement. Physically, Q models the rate at which the filter and mixing coefficients evolve with time as the MR signal and EMI are affected by a number of factors, such as moving EMI sources or patient motion. In some implementations, the process standard deviation that characterizes the system uncertainty may be chosen as a baseline for Q, which may be linearly scaled with the length of time gaps between each measurement to account for the greater probability of system state changes. In some implementations, the estimated process noise covariance Q may be set to be the time gap between measurements multiplied by a factor of $1e^{-5}$.

In some implementations, if the first batch of MR data is being processed, pre-scan data 202 may be utilized to calculate, using the pre-scan compute process 206, a pre-scan covariance 208 and a pre-scan state 209. In some implementations, said previous covariance and state data may be captured from a signal acquired by the MR system without MR signal (e.g., solely capturing noise data), a signal acquired by the MR system that has been modified to remove MR signal, or previous MR scan information.

Once the predicted state $H'_k$ and predicted covariance $P'_k$ have been calculated, the compute process 212A can use the predicted state and predicted covariance to calculate the Kalman gain 216A, which may be represented as $K_k$. The Kalman filter gain 216A can indicate an amount by which the predictions are to be corrected on time step k. To calculate the Kalman filter gain 216A, the compute process 212A can first evaluate the innovation covariance, $S_k$, on time step k using the following equation:

$$S_k = X_k P'_k X^H_k + R_k$$

In the above equation, the value $X_k$ is the state-to-measurement transition matrix. The state-to-measurement matrix may be a Toeplitz matrix generated from $Y_{ref,k}$, which is the reference signals on time step k (e.g., the reference signal 213A of the batch data 210A). As described herein, $P'_k$ is the estimated covariance for the timestep k, and $X^H_k$ is the Hermitian transpose of the state-to-measurement transition matrix. The value $R_k$ is the measurement noise covariance on time step k, which in the example shown in FIG. 2 is set as the K-space weighting 214A. The estimated measurement noise covariance can account for input measurement uncertainty, and can be a hyperparameter of the Kalman filter that is set via user input, via a configuration file, or via an external input, message, or command. A greater value of R represents a lower confidence in the input data.

Physically, the estimated measurement noise covariance may account for the expected instantaneous power in the MR echo, relative to background additive white Gaussian noise. The estimated measurement noise covariance may be time-varying and greatest near the center of K-space, the strongest MR signal is expected. In some implementations, the variance of measurement error is determined based on a few measurements of the MR system. A K-space weighting function may be applied to reduce dependency on the input to estimate interference, preventing the removal of actual MRI signal at the K-space center. In some implementations, the estimated measurement noise covariance R may be set to the K-space weighting 214A of the sample, as shown in this non-limiting example implementation.

Once the innovation covariance $S_k$ has been calculated, the compute process 212A can calculate the Kalman gain 216A by evaluating the following equation:

$$K_k = P'_k X^H_k S^{-1}_k$$

In the above equation, $K_k$ is the Kalman gain 216A, the value $P'_k$ is the estimated covariance at the timestep k, $X^H_k$ is the Hermitian transpose of the state-to-measurement transition matrix for the timestep k, and $S^{-1}_k$ is the inverse of the innovation covariance, $S_k$, on time step k.

The calculated Kalman gain 216A is then used to calculate the updated covariance 222A for the timestep k using the update process 218A. In the update process 218A, the updated covariance 222A for the timestep k can be calculated by evaluating the following equation:

$$P_k = P'_k - K_k X_k P'_k$$

In the above equation, $P_k$ is the updated covariance 222A for the timestep k, $K_k$ is the Kalman gain 216A calculated as described herein, $X_k$ is the state-to-measurement transition matrix, and $P'_k$ is the estimated covariance for the timestep k.

The updated state 224A of the timestep k can be calculated using the update process 220A and can be determined as a function of the innovation, or the measurement pre-fit residual, of the timestep k, which is represented herein as $V_k$. In the update process 220A, the innovation or the measurement pre-fit residual $V_k$ can be determined using the following equation:

$$V_k = Y_{im,k} - X_k H'_k$$

In the above equation, $Y_{im,k}$ is the imaging signal on time step k (e.g., the image signal 211A of the batch data 210A) and the value $X_k$ is the state-to-measurement transition matrix, as described herein. The value $H'_k$ is the estimated state for the current time step k, as described herein. To calculate the updated state 224A for the timestep k, which is represented herein as $H_k$, the update process 220A can evaluate the following equation:

$$H_k = H'_k + K_k V_k$$

In the above equation, $H'_k$ is the estimated state for the current time step k, $K_k$ is the Kalman gain 216A, and $V_k$ is the innovation, or the measurement pre-fit residual, of the timestep k, calculated as described herein.

Once the updated state 224A of timestep k has been calculated using the update process 220A, the denoising process 226 can perform denoising on the input batch data 210A (e.g., the image signal 211A) by subtracting estimated interference from the signal to generate the denoised batch data 228A. To do so, the denoising process 226 can evaluate the following equation:

$$N_{im,k} = Y_{im,k} - X_k H_k$$

In the above equation, the value $Y_{im,k}$ is the imaging signal on time step k (e.g., the image signal 211A), $X_k$ is the state-to-measurement transition matrix, and $H_k$ is the updated state 220A for the timestep k, calculated as described herein. The output, $N_{im,k}$, is the measurement post-fit residual, which is the filtered image signal 211A, shown in FIG. 2 as the denoised batch data 228A.

As shown, the updated covariance 222A and the updated state 224A can be provided as input to corresponding processing operations used to perform the denoising techniques described herein the next batch data (e.g., the batch data 210B). For example, a compute process 218B can perform similar operations as the compute process 218B to calculate the Kalman gain 216B based at least in part on the K-space weighting 214B for the batch data 210B and the reference signal 213B. Similarly, the update process 218B may be used to perform similar calculations to the update process 218A to calculate the updated covariance 222B for the batch data 210B, and the update process 220B may be used to perform similar calculations to the update process 218A to calculate the updated state 224B for the batch data 210B.

The updated state 224B may be used by the denoise process 226 to generate the denoised batch data 228B by subtracting estimated interference from the image signal 211B, as described herein. The updated state 224B and the updated covariance 222B can be provided as input to processing operations for a subsequent batch of MR scan data, which may be denoised using techniques similar to those described herein. This process may be repeated until all batches of the sample have been processed. Once denoised signal data has been generated for all batches, further processing may be performed to reconstruct the MR images from the k-space data in the denoise batch data 228A-228B, as described in connection with FIGS. 3A and 3B.

In some implementations, after the denoising process 226 generates the denoised batch data 228A, and after the filtering process has been completed for all batches 210A-210B, a smoothing process may be performed (e.g., a Kalman smoother). The smoothing process may be a "backward pass" compared to the "forward pass" of the Kalman filter described herein, in which an estimate is provided by the saved state and covariance from the Kalman filter. In some implementations, a modified Bryson-Frazier smoother may be utilized. Starting from the last data point (e.g., the last denoised batch data), the smoother "corrects" the filter prediction backward by evaluating the following equations:

$$N'_{im,k} = N_{im,k} + X_k P_k \lambda_k$$

$$\lambda_{k-1} = \lambda_k - X^H_k \left( K^T_k \lambda_k + V_k / S_k \right)$$

In the above equations, $N'_{im,k}$ is the smoothed denoised batch data for the timestep k, $N_{im,k}$ is the measurement post-fit residual (e.g., the denoised batch data), $X_k$ is the is the state-to-measurement transition matrix, $P_k$ is the updated covariance for the timestep k, and $\lambda_k$ is the adjoint vector that updates the smoother mean for the timestep k. The value $X^H_k$ is the Hermitian transpose of the state-to-measurement matrix for the timestep k, $K^T_k$ is the transpose of the Kalman gain for the timestep k, $V_k$ is the innovation, or the measurement pre-fit residual, of the timestep k, and $S_k$, is the innovation covariance on time step k. The smoothing step can improve interference removal performance of the Kalman filter, as the estimates are generated based on all collected data compared to partial observation.

As shown, in some implementations, the pre-scan data 202 may be provided as input to the first timestep in the Kalman filter. The pre-scan compute process 206 may be utilized to generate corresponding pre-scan covariance data 208 and pre-scan state data 209, which may be provided as the covariance the state data for the previous timestep in the prediction step described herein. The pre-scan compute process 206 may initialize the pre-scan state 209 and the pre-scan covariance 208 by executing all the steps described herein to process a batch of MR data except for the correction step, since no output is required from this stage. In some implementations, during the MR scan, the batches of data are acquired and sent to the Kalman filter for interference removal, which runs all the steps described above and outputs noise corrected imaging channel data for further processing.

Figures 3A, 3B:
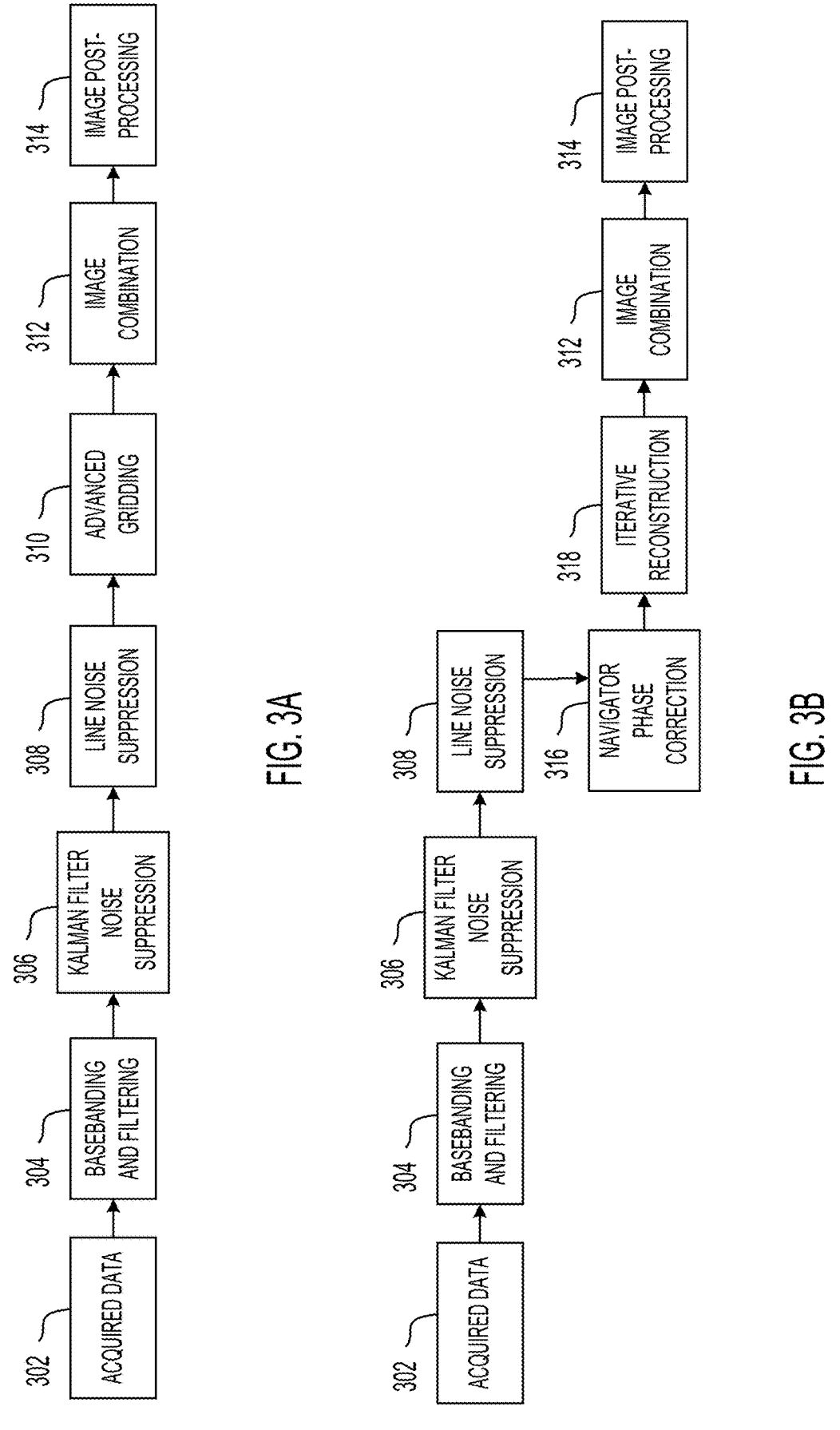
FIGS. 3A and 3B depict example data flow diagrams of image reconstruction pipelines including the EMI removal techniques described herein, in accordance with one or more implementations.

Referring to FIGS. 3A and 3B, depicted are example data flow diagrams 300A and 300B of image reconstruction pipelines including the EMI removal techniques described herein, in accordance with one or more implementations. In FIG. 3A, the pipeline 300A may be utilized to reconstruct images from T1, T2, or FLAIR MR scans. As shown, the process begins by acquiring data at step 302, which may be performed using, in a non-limiting example, the MR system 100 of FIG. 1. The acquired data may then be applied to a basebanding and filtering process 304, in which the acquired data is basebanded and filtered. This pre-processed data is then provided as input to a Kalman filter noise suppression process 306, which may be similar to the process described in connection with FIG. 2. A secondary stage of batch noise suppression process 308 is then performed to remove residual noise that may not have been completely removed by the Kalman filter process prior to image reconstruction.

The processed signal data may then be provided as input to a gridding process at 310, in which iterative gridding techniques may be performed for image reconstruction. Image combination processes may then be performed at step 312, which may include processes such as coil combination and echo-parity combination, in some implementations. Image post-processing may then be performed, which may include further image-based denoising techniques, image orientation transforms, geometric distortion correction, coil intensity correction, and image output processes, among others.

In FIG. 3B, a similar image reconstruction pipeline 300B is shown, which may be applied to DWI scans in a non-limiting example. As shown, the steps 302-310 described in connection with FIG. 3A may be similar, except applied to DWI scan data rather than T1, T2, or FLAIR data. In addition, a navigator phase correction process 316 and an iterative reconstruction process 318 are performed. Once reconstructed, similar image combination processes 312 and image post-process processes 314 may be performed as described in connection with FIG. 3A.

Figure 4B:
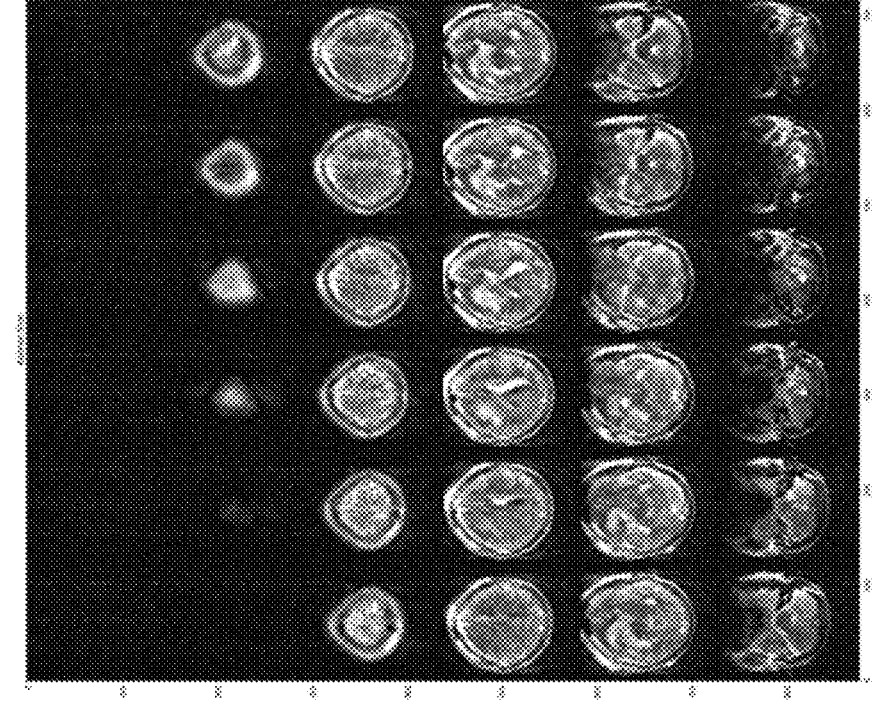
FIGS. 4A and 4B show examples of narrowband noise removed using spectral-based noise correction and the noise removal techniques described herein, respectively, in accordance with one or more implementations.
Figure 4A:
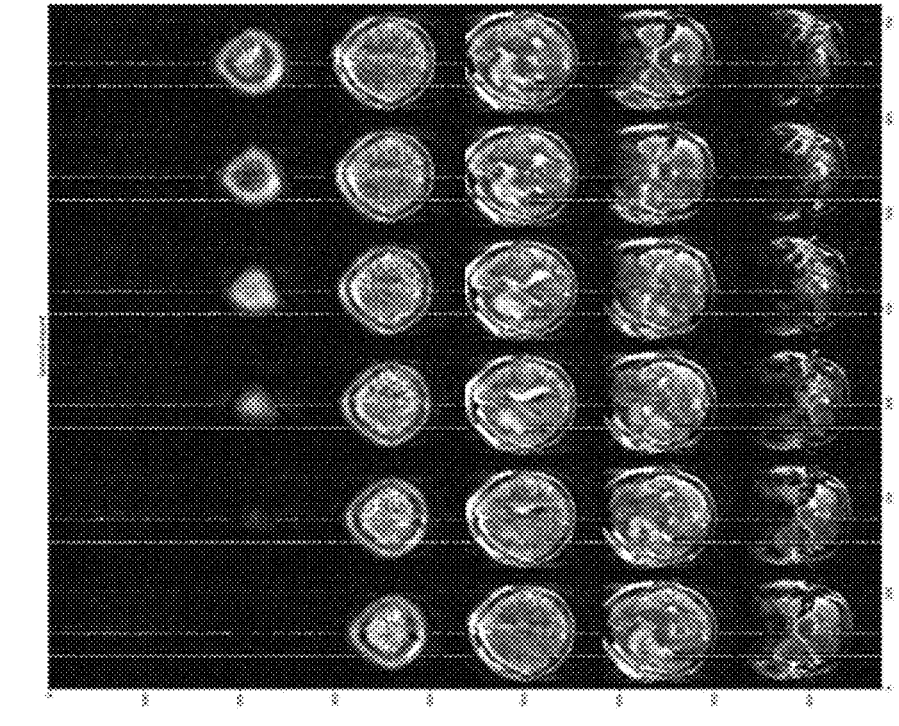

Referring to FIGS. 4A and 4B, depicted are example images 400A and 400B of narrowband noise removed using conventional, spectral-based noise correction and the noise removal techniques described herein, respectively, in accordance with one or more implementations. As shown, the image 400A processed using spectral-based techniques result in vertical artifacts across scan images, while those artifacts are significantly diminished in the image 400B processed using the Kalman filter-based approaches described herein.

Figure 5B:
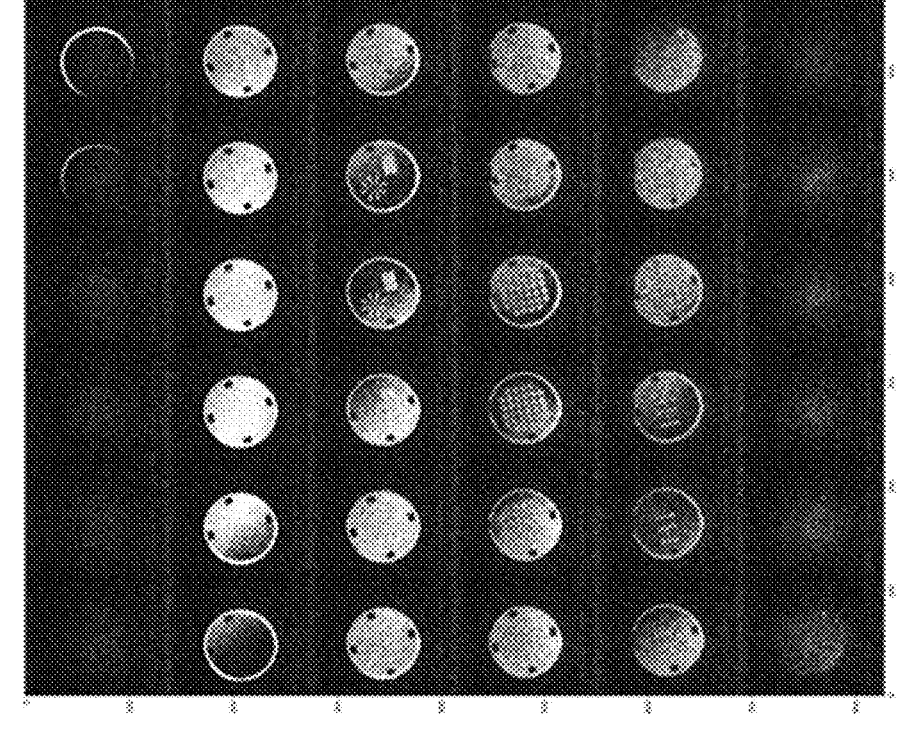
FIGS. 5A and 5B show examples of wideband noise removed using spectral-based noise correction and the noise removal techniques described herein, respectively, in accordance with one or more implementations.
Figure 5A:
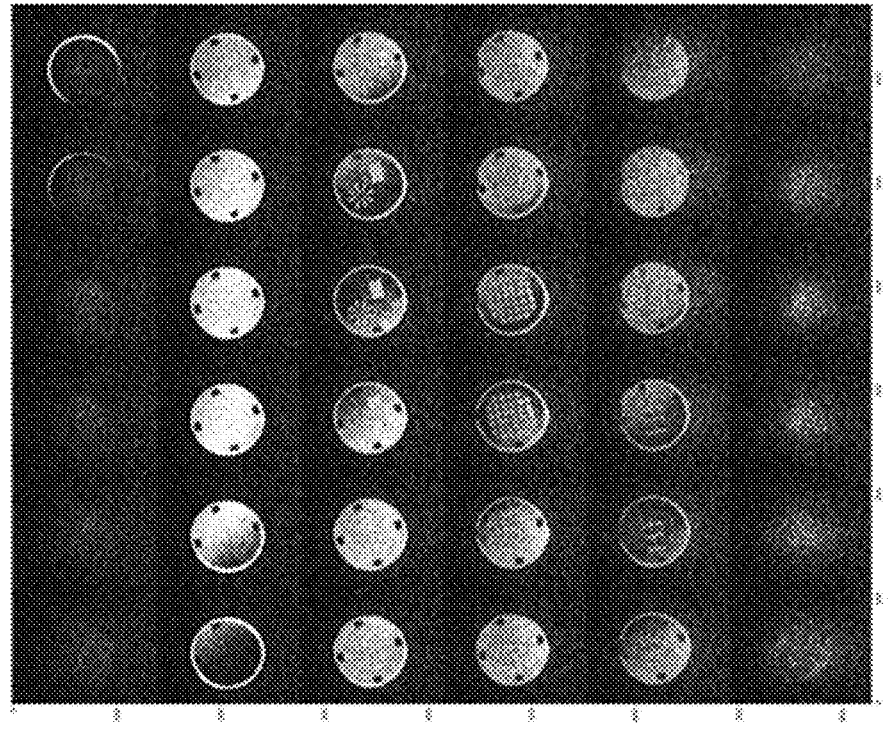

Referring to FIGS. 5A and 5B, depicted are example images 500A and 500B of wideband noise removed using spectral-based noise correction and the noise removal techniques described herein, respectively, in accordance with one or more implementations. As shown, wideband noise is shown throughout the image 500A processed using spectral-based filtering techniques, while the wideband noise is significantly reduced in the image 500B processed using the Kalman filter-based techniques described herein. The image 500B shows improved resolution and clarity compared to the image 500A.

Figure 6B:
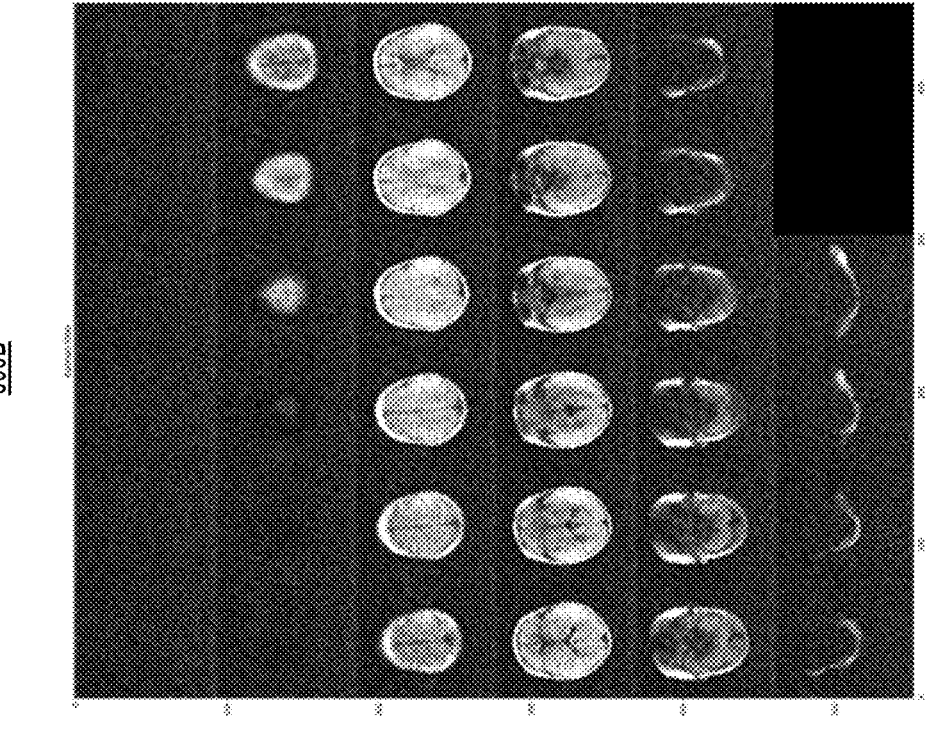
FIGS. 6A and 6B show examples of combined wideband and narrowband noise removed using spectral-based noise correction and the noise removal techniques described herein, respectively, in accordance with one or more implementations.
Figure 6A:
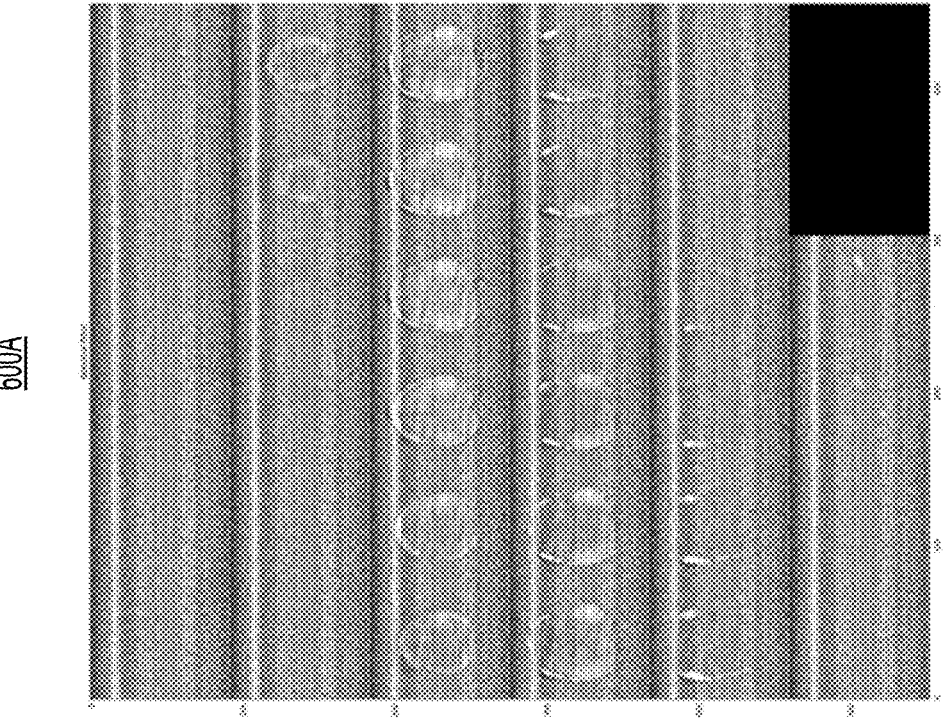

Referring to FIGS. 6A and 6B, depicted are example images 600A and 600B of combined wideband and narrowband noise removed using spectral-based noise correction and the noise removal techniques described herein, respectively, in accordance with one or more implementations. As shown, significant noise is present in the image 600A, and any details can barely be discerned. In contrast, the image 600B, which was processed using the Kalman filter-based techniques described herein, provides much greater clarity with most noise removed.

Figure 7B:
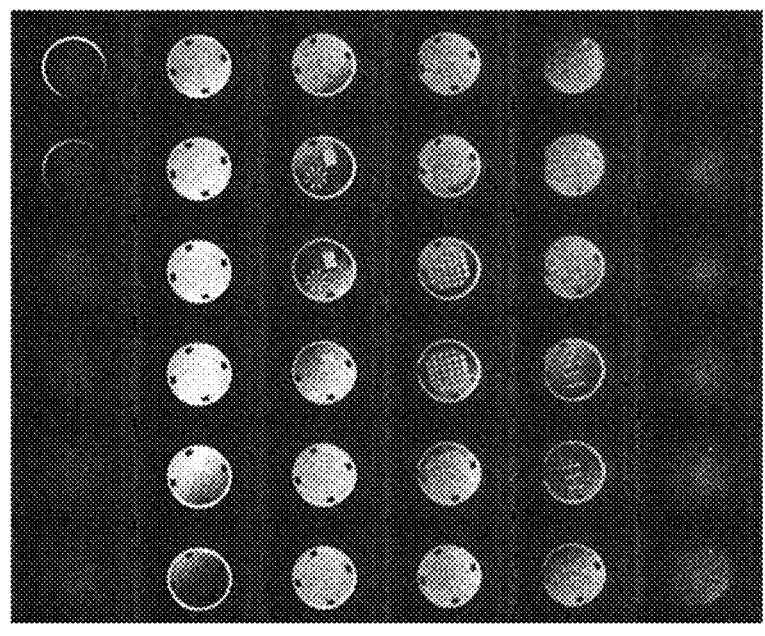
FIGS. 7A and 7B show examples of the noise removal techniques described herein performed on an entire MR scan and performed on each repetition (TR) of an MR scan, respectively, in accordance with one or more implementations.
Figure 7A:
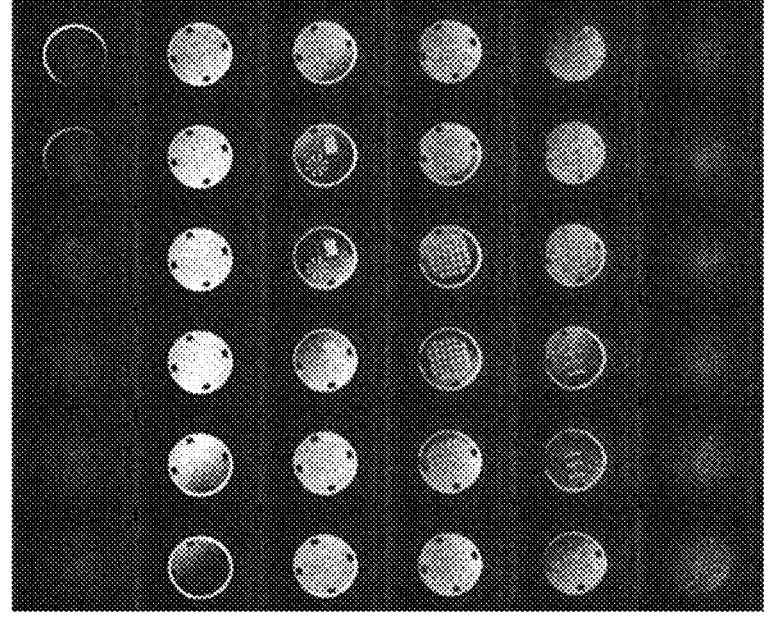

Referring to FIGS. 7A and 7B, depicted are example images 700A and 700B of the noise removal techniques described herein performed on an entire MR scan and performed on TR of an MR scan, respectively, in accordance with one or more implementations. Since the Kalman filter updates the state and covariance at every new batch of data, as described herein, and the update confidence is highly dependent on the estimated process noise covariance Q which is linearly scaled to the time gap between the samples, large gaps between measurements can make the state and covariance inaccurate as initial estimation for the new samples.

For sequences with larger time gaps between each TR, the Kalman filter may be less dependent on its previous state and covariance estimation. Therefore, when processing scans with a large number of lines under memory constraints, the Kalman filter can be computed independently for each TR without conceivable degradation, as shown in the comparison between the images 700A and 700B, where the same covariance and state estimate from pre-scan data can be used as initial values for every TR. In some implementations, all the data available is processed at once if possible, unless the number of lines to be processed is greater than a predetermined memory threshold (e.g., 10,000 lines, etc.), when each TR is processed independently.

Figures 8A, 8B, 8C:
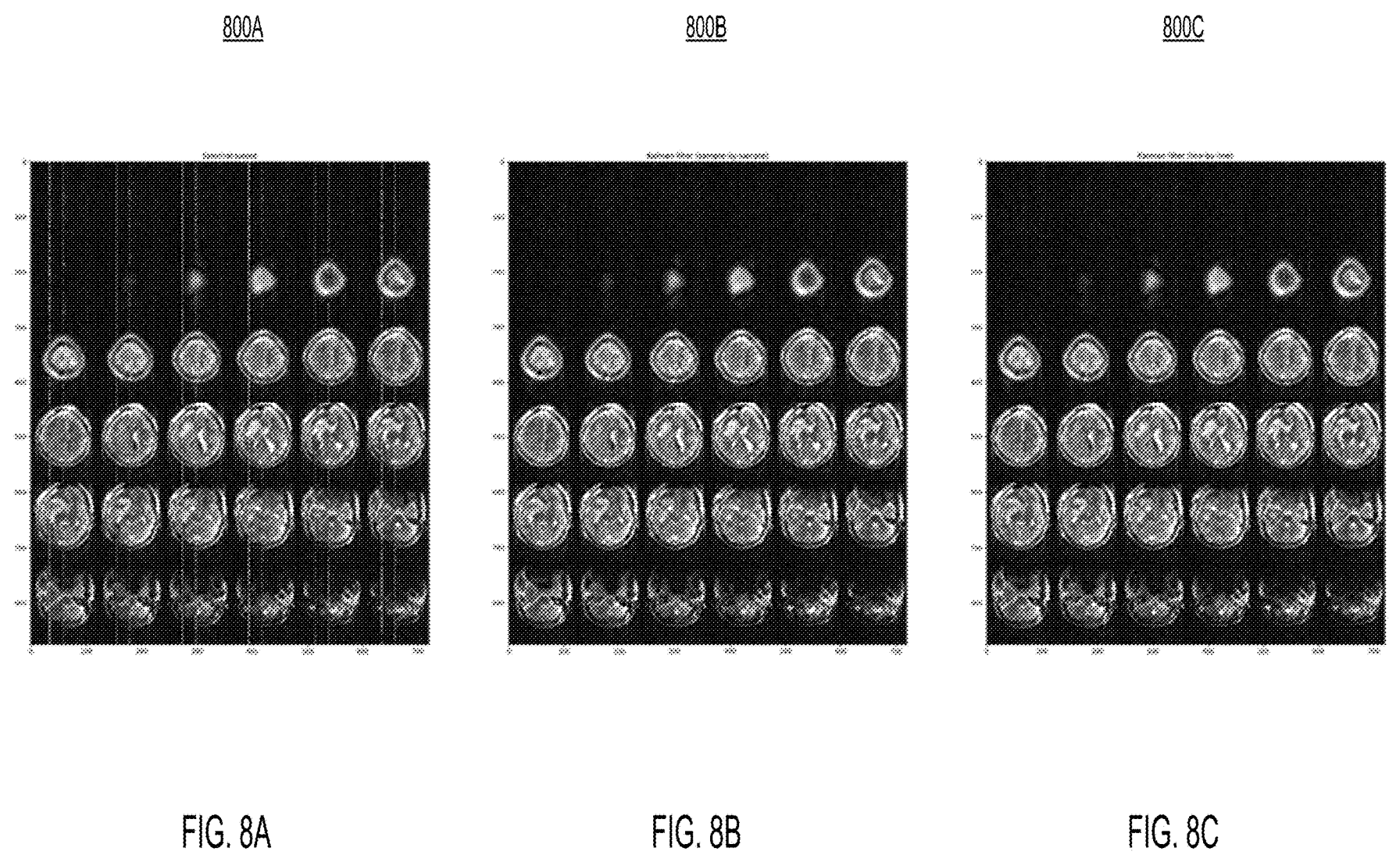

Referring to FIGS. 8A, 8B, and 8C, depicts example images 800A, 800B, and 800C, showing spectral-based noise removal, noise removal according to the techniques described herein performed sample-by-sample, and noise removal according to the techniques described herein performed batch-by-batch, respectively, in accordance with one or more implementations. As described herein, the Kalman filter be used to process batch of input data, update its state, and apply correction. The Kalman filter can also compute its state and correct per chunks of data, assuming the interference has not varied a lot within the chunk. In some implementations, this can increase the processing speed significantly. In a non-limiting example, the data per readout (batch-by-batch) can be processed instead of per sample (sample-by-sample). In another non-limiting example, updating per every readout line including ~100 samples takes less than 1 ms.

Figure 9:
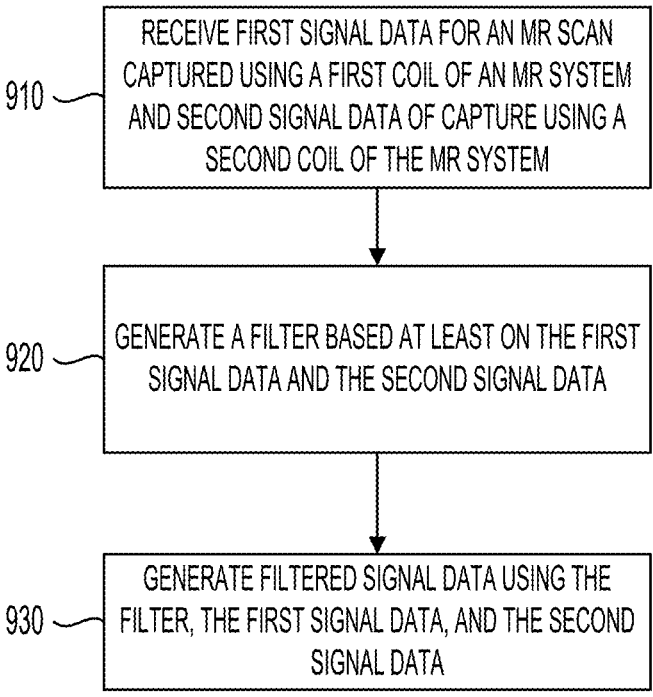
FIG. 9 depicts a flowchart of an example method of removing electromagnetic interference from magnetic resonance images.

Referring to FIG. 9, depicted is a flowchart of an example method 900 of removing electromagnetic interference from magnetic resonance images, in accordance with one or more implementations. The method 900 may be executed using any suitable computing system (e.g., the controller 106, the computing device 104 of FIG. 1, the computing system 1000 of FIG. 10, etc.) of an MR system (e.g., the MRI system 100). The MR system used to perform the method 900 may have a magnetic field inhomogeneity of less than or equal to 1000 parts-per-million. The MR system used to perform the method 900 may have a magnetic resonance frequency inhomogeneity greater than 1000 Hz. It may be appreciated that certain steps of the method 900 may be executed in parallel (e.g., concurrently) or sequentially, while still achieving useful results.

The method 900 may include act 910, in which the MR system (e.g., the MR system 100) receives first signal data (e.g., imaging signal data) for an MR scan captured using a first coil (e.g., a receive coil 126) of the MR system and second signal data (e.g., reference signal data) captured using a second coil (e.g., the reference coil 130) of the MR system. The first and second coil may operate at the same time during the MR scan. The imaging signal data can include both external noise data (e.g., electromagnetic interference) and MR signal (e.g., an MR image or calibration signals), while the reference signal data can include only the external noise data. The reference coil can be positioned in the MR system such that it captures substantially the same interference as the imaging coil, without capturing any MR signal during the scan. The first signal data and the second signal data may be retrieved from a storage or memory, or may be received during an MR scan (e.g., as part of an MR image processing pipeline). The signal data may include any type of sequence-based MR data, e.g., k-space data, from scans including but not limited to T1, T2, FLAIR, DWI, or calibration scans.

The method 900 may include act 920, in which the MR system generates a filter based at least on the first signal data and the second signal data. The filter may be generated, in a non-limiting example, using the processes described in connection with FIG. 2. The filter may include the filter a Kalman filter, a Kalman smoother, an extended Kalman filter, an unscented Kalman filter, or any other variations of Kalman filtering. As described herein, generating the filter can be based on an estimated process noise covariance (e.g., Q) and an estimated measurement noise covariance (e.g., R). The Kalman filter may be an oth order Kalman filter, and in a non-limiting example, may be an $8^{th}$ order Kalman filter. As described herein, the filter may include one or more transfer functions that are used to calculate updated state (e.g., state 224A) and updated covariance (e.g., updated covariance 222A) using the second signal data and the first signal data and a previous state and covariance of the MR scan over time.

The Kalman filter process may be performed over time, with batch processing (e.g., batch-by-batch processing, with each like including about 100 samples in a non-limiting example) occurring at each time step. In some implementations, the Kalman filter is executed on a sample-by-sample basis. Performing the Kalman filtering process includes determining a state and a covariance for each current time step of the MR scan based at least on the first and the second signal data. The time step may correspond to a batch of data as it is captured or retrieved for processing. Executing the Kalman filter process may include determining a state-to-measurement transition matrix (e.g., $X_k$) based at least on the second signal data. The state-to-measurement matrix may be a Toeplitz matrix generated from the second signal data (e.g., the reference signal). Generating the state and the covariance when executing the filter may be based on noise data generated using a third signal acquired by the MR system without MR signal, a fourth signal acquired by the MR system that has been modified to remove MR signal, or previous MR scan information (e.g., pre-scan data 202, etc.).

The method 900 may include act 930, in which the MR system generates filtered signal data using the filter, the first signal data, and the second signal data. To do so, the filtered signal data may be generated by subtracting the estimated noise from the first signal data. The estimated noise may be determined using the filter and the state-to-measurement transition matrix. In some implementations, a smoothing process may be applied to the denoised signal data after all data has been collected. The smoothing process may be a backward pass of the Kalman filter, as described herein.

The state and covariance for each time step may be calculated and utilized to estimate a predicted state and covariance in a prediction phase of the next time step, as described herein. In a non-limiting example, the MR system can receive third signal data for the MR scan captured using the first coil and fourth signal data captured using the second coil for a second time step. The second time step may occur before or after the first time step. A second filter may then be generated for the second timestep based at least on the filter for the first timestep, the third signal data, and the fourth signal data. Filtered signal data for the second time step (e.g., the batch data 210B) may be generated using the second filter, the third signal data, and the fourth signal data. This process may be repeated for signal data of each timestep until all signal data has been processed. The denoised signal data may then be stored and/or provided for further processing operations, as described herein.

Figure 10:
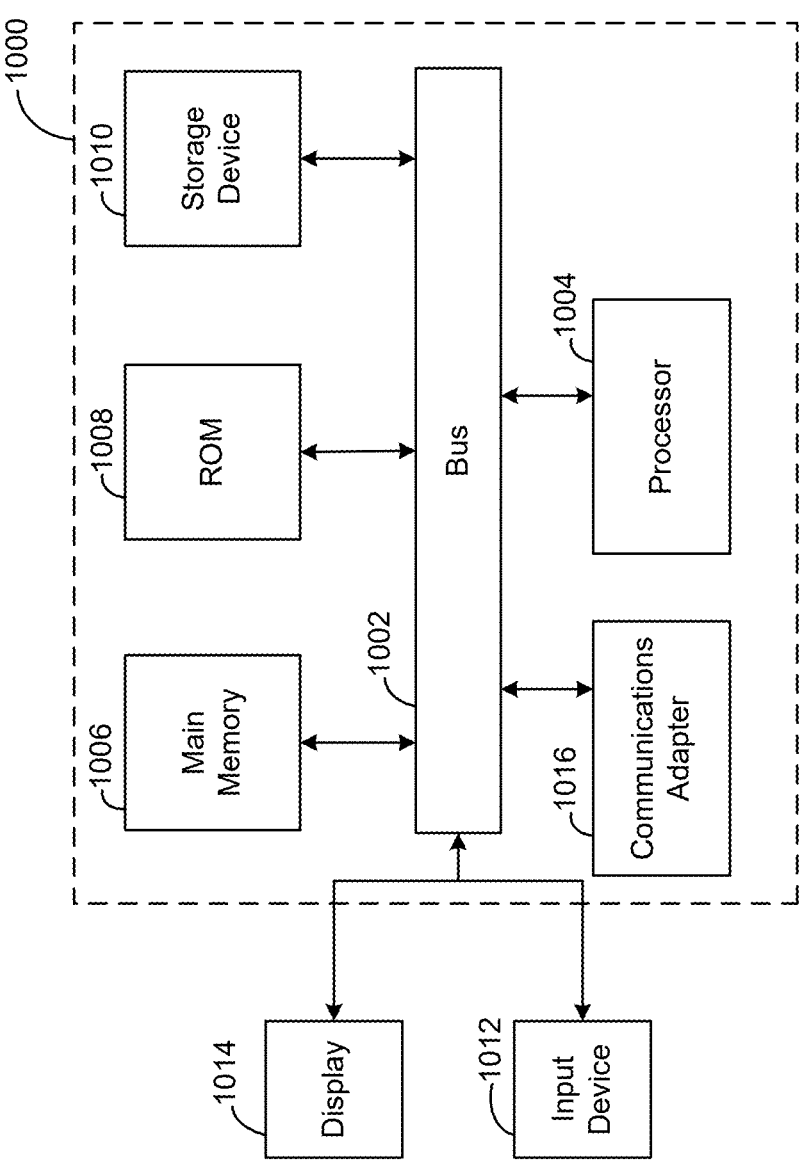
FIG. 10 is a block diagram of an example computing system suitable for use in the various arrangements described herein, in accordance with one or more example implementations.

FIG. 10 illustrates a component diagram of an example computing system suitable for use in the various implementations described herein, according to an example implementation. In a non-limiting example, the computing system 1000 may implement a computing device 104 or controller 106 of FIG. 1, or various other example systems and devices described in the present disclosure.

The computing system 1000 includes a bus 1002 or other communication component for communicating information and a processor 1004 coupled to the bus 1002 for processing information. The computing system 1000 also includes main memory 1006, such as a RAM or other dynamic storage device, coupled to the bus 1002 for storing information, and instructions to be executed by the processor 1004. Main memory 1006 may also be used for storing position information, temporary variables, or other intermediate information during execution of instructions by the processor 1004. The computing system 1000 may further include a ROM 1008 or other static storage device coupled to the bus 1002 for storing static information and instructions for the processor 1004. A storage device 1010, such as a solid-state device, magnetic disk, or optical disk, is coupled to the bus 1002 for persistently storing information and instructions.

The computing system 1000 may be coupled via the bus 1002 to a display 1014, such as a liquid crystal display, or active matrix display, for displaying information to a user. An input device 1012, such as a keyboard including alphanumeric and other keys, may be coupled to the bus 1002 for communicating information, and command selections to the processor 1004. In another implementation, the input device 1012 has a touch screen display. The input device 1012 may include any type of biometric sensor, or a cursor control, such as a mouse, a trackball, or cursor direction keys, for communicating direction information and command selections to the processor 1004 and for controlling cursor movement on the display 1014.

In some implementations, the computing system 1000 may include a communications adapter 1016, such as a networking adapter. Communications adapter 1016 may be coupled to bus 1002 and may be configured to enable communications with a computing or communications network or other computing systems. In various illustrative implementations, any type of networking configuration may be achieved using communications adapter 1016, such as wired (e.g., via Ethernet), wireless (e.g., via Wi-Fi, Bluetooth), satellite (e.g., via GPS) pre-configured, ad-hoc, LAN, WAN, and the like.

According to various implementations, the processes of the illustrative implementations that are described herein may be achieved by the computing system 1000 in response to the processor 1004 executing an implementation of instructions contained in main memory 1006. Such instructions may be read into main memory 1006 from another computer-readable medium, such as the storage device 1010. Execution of the implementation of instructions contained in main memory 1006 causes the computing system 1000 to perform the illustrative processes described herein. One or more processors in a multi-processing implementation may also be employed to execute the instructions contained in main memory 1006. In alternative implementations, hard-wired circuitry may be used in place of or in combination with software instructions to implement illustrative implementations. Thus, implementations are not limited to any specific combination of hardware circuitry and software.

Various example implementations and embodiments include, without limitation, any of the below (or any combination thereof):

Embodiment AA: A method of removing interference in magnetic resonance (MR) systems, comprising: receiving, by one or more processors, first signal data for an MR scan captured using one or more coils of an MR system and second signal data captured using the one or more coils of the MR system; generating, by the one or more processors, a filter based at least on the first signal data and the second signal data; and generating, by the one or more processors, filtered signal data using the filter, the first signal data, and the second signal data.

Embodiment AB: The method of Embodiment AA, wherein the one or more coils comprises a first coil and a second coil.

Embodiment AC: The method of either Embodiment AA or AB, wherein the first signal data is captured using a first coil and the second signal data is captured using a second coil.

Embodiment AD: The method of any of Embodiments A-C, wherein the filter comprises a Kalman filter, a Kalman smoother, an extended Kalman filter, an unscented Kalman filter, and/or any other variations of Kalman filters, or any combination thereof.

Embodiment BA: A method of removing interference in magnetic resonance (MR) systems, comprising: receiving, by one or more processors, first signal data for an MR scan captured using a first coil of an MR system and second signal data captured using a second coil of the MR system; generating, by the one or more processors, a filter based at least on the first signal data and the second signal data; and generating, by the one or more processors, filtered signal data using the filter, the first signal data, and the second signal data.

Embodiment BB: The method of Embodiment BA, wherein the filter comprises a Kalman filter, a Kalman smoother, an extended Kalman filter, an unscented Kalman filter, and/or any other variations of Kalman filters, or any combination thereof.

Embodiment BC: The method of either Embodiment BA or BB, wherein the first coil comprises an imaging coil and the second coil comprises a reference coil.

Embodiment BD: The method of any of Embodiments BA-BC, wherein the filter comprises one or more transfer functions between the second signal data and the first signal data, and a state of the MR scan over time.

Embodiment BE: The method of any of Embodiments BA-BD, further comprising determining, by the one or more processors, a state and a covariance for a current time step of the MR scan based at least on the first and the second signal data.

Embodiment BF: The method of any of Embodiments BA-BE, further comprising determining, by the one or more processors, a state-to-measurement transition matrix based at least on the second signal data.

Embodiment BG: The method of Embodiment BF, wherein generating the filtered signal data comprises subtracting, by the one or more processors, estimated noise from the first signal data, the estimated noise determined using the filter and the state-to-measurement transition matrix.

Embodiment BH: The method of any of Embodiments BA-BG, wherein the first signal data and the second signal data correspond to a first timestep of the MR scan, the method further comprising: receiving, by the one or more processors, third signal data for the MR scan captured using the first coil and fourth signal data captured using the second coil, the third signal data and the fourth signal data corresponding to a second timestep of the MR scan, the second timestep occurring before or after the first timestep; generating, by the one or more processors, a second filter for the second timestep based at least on the filter, the third signal data, and the fourth signal data; and generating, by the one or more processors, second filtered signal data using the second filter, the third signal data, and the fourth signal data.

Embodiment BI: The method of any of Embodiments BA-BH, wherein generating the filter is further based on an estimated process noise covariance, and an estimated measurement noise covariance.

Embodiment BJ: The method of any of Embodiments BA-BI, wherein generating the filter is further based on noise data generated using a third signal acquired by the MR system without MR signal, a fourth signal acquired by the MR system that has been modified to remove MR signal, or previous MR scan information.

Embodiment CA: A system comprising one or more processors, and/or one or more devices comprising one or more processors, the system and/or the one or more devices configured to perform any of the above methods.

Embodiment DA: A system of removing interference in magnetic resonance (MR) systems, comprising: one or more processors, the one or more processors configured to: receive first signal data for an MR scan captured using one or more coils of an MR system and second signal data captured using the one or more coils of the MR system; generate a filter based at least on the first signal data and the second signal data; and generate filtered signal data using the filter, the first signal data, and the second signal data.

Embodiment DB: The system of Embodiment DA, wherein the one or more coils comprises a first coil and a second coil.

Embodiment DC: The system of either Embodiment DA or DB, wherein the first signal data is captured using a first coil and the second signal data is captured using a second coil.

Embodiment DD: The system of any of Embodiments DA-DC, wherein the filter comprises a Kalman filter, a Kalman smoother, an extended Kalman filter, an unscented Kalman filter, and/or any other variations of Kalman filters, or any combination thereof.

Embodiment EA: A system of removing interference in magnetic resonance (MR) systems, comprising: one or more processors, the one or more processors configured to: receive first signal data for an MR scan captured using a first coil of an MR system and second signal data captured using a second coil of the MR system; generate a filter based at least on the first signal data and the second signal data; and generate filtered signal data using the filter, the first signal data, and the second signal data.

Embodiment EB: The system of Embodiment EA, wherein the filter comprises a Kalman filter, a Kalman smoother, an extended Kalman filter, an unscented Kalman filter, and/or any other variations of Kalman filter, or any combination thereof.

Embodiment EC: The system of either Embodiment EA or EB, wherein the first coil comprises an imaging coil and the second coil comprises a reference coil.

Embodiment ED: The system of any of Embodiments EA-EC, wherein the filter comprises one or more transfer functions between the second signal data and the first signal data, and a state of the MR scan over time.

Embodiment EE: The system of any of Embodiments EA-ED, wherein the one or more processors are further configured to determine a state and a covariance for a current time step of the MR scan based on the first and the second signal data.

Embodiment EF: The system of any of Embodiments EA-EE, wherein the one or more processors are further configured to determine a state-to-measurement transition matrix based on the second signal data.

Embodiment EG: The system of Embodiment EF, wherein the one or more processors are further configured to generate the filtered signal data by performing operations comprising subtracting estimated noise from the first signal data, the estimated noise determined using the filter and the state-to-measurement transition matrix.

Embodiment EH: The system of any of Embodiments EA-EG, wherein the first signal data and the second signal data correspond to a first timestep of the MR scan, the one or more processors further configured to: receive third signal data for the MR scan captured using the first coil and fourth signal data captured using the second coil, the third signal data and the fourth signal data corresponding to a second timestep of the MR scan, the second timestep occurring before or after the first timestep; generate a second filter for the second timestep based at least on the filter, the third signal data, and the fourth signal data; and generate second filtered signal data using the second filter, the third signal data, and the fourth signal data.

Embodiment EI: The system of any of Embodiments EA-EH, wherein the one or more processors are further configured to generate the filter further based on an estimated process noise covariance and an estimated measurement noise covariance.

Embodiment EJ: The system of any of Embodiments EA-EI, wherein the one or more processors are further configured to generate the filter further based on noise data generated using a third signal acquired by the MR system without MR signal, a fourth signal acquired by the MR system that has been modified to remove MR signal, or previous MR scan information.

Embodiment FA: A method of removing interference in magnetic resonance (MR) systems, comprising: generating a model to characterize an imaging channel and a reference channel such that electromagnetic interference (EMI) exists on both the imaging channel and the reference channel, and an MR signal exists only on the imaging channel; modeling time-domain impulse response evolving from batch-to-batch with an oth order Kalman filter or smoother; and removing modeled EMI from the imaging channel to denoise the MR signal.

Embodiment GA: A system comprising one or more processors, and/or one or more devices comprising one or more processors, the system and/or the one or more devices configured to perform the method of Embodiment FA.

Embodiment HA: A method comprising: receiving, by one or more processors, first signal data for an MR scan captured using a first coil and second signal data captured using a second coil; generating, by the one or more processors, a filter based at least on the first signal data and the second signal data; and generating, by the one or more processors, filtered signal data using the filter, the filtered signal data being based on the first signal data and the second signal data.

Embodiment HB: The method of Embodiment HA, wherein the method is performed by an MR system to remove interference in the MR scan.

Embodiment HC: The method of either Embodiment HA or HB, wherein the filter comprises or consists of a Kalman filter.

Embodiment HD: The method of any of Embodiments HA-HC, wherein the filter comprises or consists of a Kalman smoother.

Embodiment HE: The method of any of Embodiments HA-HD, wherein the filter comprises or consists of an extended Kalman filter.

Embodiment HF: The method of any of Embodiments HA-HE, wherein the filter comprises or consists of an unscented Kalman filter.

Embodiment HG: The method of any of Embodiments HA-HF, wherein the first coil comprises or consists of an imaging coil.

Embodiment HH: The method of any of Embodiments HA-HG, wherein the second coil comprises or consists of a reference coil.

Embodiment HI: The method of any of Embodiments HA-HH, wherein the filter comprises one or more transfer functions as a state of the MR scan over time.

Embodiment HJ: The method of Embodiment HI, wherein the one or more transfer functions are between the second signal data and the first signal data.

Embodiment HK: The method of any of Embodiments HA-HJ, comprising determining, by the one or more processors, a state for a current time step of the MR scan based at least on the first signal data and the second signal data.

Embodiment HL: The method of any of Embodiments HA-HK, comprising determining, by the one or more processors, a covariance for a current time step of the MR scan based at least on the first signal data and the second signal data.

Embodiment HM: The method of any of Embodiments HA-HL, comprising determining, by the one or more processors, a state-to-measurement transition matrix based at least on the second signal data.

Embodiment HN: The method of Embodiment HM, wherein generating the filtered signal data comprises subtracting, by the one or more processors, estimated noise from the first signal data.

Embodiment HO: The method of Embodiment HN, wherein the estimated noise is determined using the filter and the state-to-measurement transition matrix.

Embodiment HP: The method of any of Embodiments HA-HO, wherein the first signal data and the second signal data correspond to a first timestep of the MR scan, and wherein the method comprises: receiving, by the one or more processors, third signal data for the MR scan captured using the first coil and fourth signal data captured using the second coil, the third signal data and the fourth signal data corresponding to a second timestep of the MR scan, the second timestep occurring before or after the first timestep; generating, by the one or more processors, a second filter for the second timestep based at least on the filter, the third signal data, and the fourth signal data; and generating, by the one or more processors, second filtered signal data using the second filter, the third signal data, and the fourth signal data.

Embodiment HQ: The method of any of Embodiments HA-HP, wherein generating the filter is further based on an estimated process noise covariance.

Embodiment HR: The method of any of Embodiments HA-HQ, wherein generating the filter is further based on an estimated measurement noise covariance.

Embodiment HS: The method of any of Embodiments HA-HR, wherein generating the filter is further based on noise data generated using a third signal acquired without MR signal, a fourth signal acquired that has been modified to remove MR signal, and/or previous MR scan information.

Embodiment IA: A system for removing interference in MR scans, comprising: one or more processors, the one or more processors configured to: receive first signal data for an MR scan captured using a first coil of an MR system and second signal data captured using a second coil of the MR system; generate a filter based at least on the first signal data and the second signal data; and generate filtered signal data using the filter.

Embodiment IB: The method of Embodiment IB, wherein the system for removing interference in MR scans is a component of the MR system.

Embodiment IC: The method of either Embodiment IA or IB, wherein the filtered signal is generated based on the first signal data and the second signal data.

Embodiment ID: The method of any of Embodiments IA-IC, wherein the filter comprises or consists of a Kalman filter, a Kalman smoother, an extended Kalman filter, and/or an unscented Kalman filter.

Embodiment IE: The method of any of Embodiments IA-ID, wherein the first coil comprises an imaging coil and/or the second coil comprises a reference coil.

Embodiment IF: The method of any of Embodiments IA-IE, wherein the filter comprises one or more transfer functions between the second signal data and the first signal data, and a state of the MR scan over time.

Embodiment IG: The method of any of Embodiments IA-IF, wherein the one or more processors are further configured to determine a state and/or a covariance for a current time step of the MR scan based on the first signal data and the second signal data.

Embodiment IH: The method of any of Embodiments IA-IG, wherein the one or more processors are further configured to determine a state-to-measurement transition matrix based on the second signal data.

Embodiment II: The method of Embodiment IH, wherein the one or more processors are configured to generate the filtered signal data by performing operations comprising subtracting estimated noise from the first signal data, the estimated noise determined using the filter and the state-to-measurement transition matrix.

Embodiment IJ: The method of any of Embodiments IA-II, wherein the first signal data and the second signal data correspond to a first timestep of the MR scan, the one or more processors further configured to: receive third signal data for the imaging scan captured using the first coil and fourth signal data captured using the second coil, the third signal data and the fourth signal data corresponding to a second timestep of the imaging scan, the second timestep occurring before or after the first timestep; generate a second filter for the second timestep based at least on the filter, the third signal data, and the fourth signal data; and generate second filtered signal data using the second filter, the third signal data, and the fourth signal data.

Embodiment IK: The method of any of Embodiments IA-IJ, wherein the one or more processors are configured to generate the filter further based on an estimated process noise covariance and an estimated measurement noise covariance.

Embodiment IL: The method of any of Embodiments IA-IK, wherein the one or more processors are configured to generate the filter further based on noise data generated using a third signal acquired by the MR system without MR signal, a fourth signal acquired by the MR system that has been modified to remove MR signal, and/or previous MR scan information.

Embodiment JA: A method of removing interference in MR scans, comprising: generating a model to characterize an imaging channel and a reference channel such that electromagnetic interference (EMI) exists on both the imaging channel and the reference channel, and an MR signal exists only on the imaging channel; modeling time-domain impulse response evolving from batch-to-batch with a Kalman filter, a Kalman smoother, an extended Kalman filter, and/or an unscented Kalman filter; and removing modeled EMI from the imaging channel to denoise the MR signal.

The implementations described herein have been described with reference to drawings. The drawings illustrate certain details of specific implementations that implement the systems, methods, and programs described herein. Describing the implementations with drawings should not be construed as imposing on the disclosure any limitations that may be present in the drawings.

It should be understood that no claim element herein is to be construed under the provisions of 35 U.S.C. § 112(f), unless the element is expressly recited using the phrase "means for."

As used herein, the term "circuit" may include hardware structured to execute the functions described herein. In some implementations, each respective "circuit" may include machine-readable media for configuring the hardware to execute the functions described herein. The circuit may be embodied as one or more circuitry components including, but not limited to, processing circuitry, network interfaces, peripheral devices, input devices, output devices, sensors, etc. In some implementations, a circuit may take the form of one or more analog circuits, electronic circuits (e.g., integrated circuits (IC), discrete circuits, system on a chip (SOC) circuits), telecommunication circuits, hybrid circuits, and any other type of "circuit." In this regard, the "circuit" may include any type of component for accomplishing or facilitating achievement of the operations described herein. In a non-limiting example, a circuit as described herein may include one or more transistors, logic gates (e.g., NAND, AND, NOR, OR, XOR, NOT, XNOR), resistors, multiplexers, registers, capacitors, inductors, diodes, wiring, and so on.

The "circuit" may also include one or more processors communicatively coupled to one or more memory or memory devices. In this regard, the one or more processors may execute instructions stored in the memory or may execute instructions otherwise accessible to the one or more processors. In some implementations, the one or more processors may be embodied in various ways. The one or more processors may be constructed in a manner sufficient to perform at least the operations described herein. In some implementations, the one or more processors may be shared by multiple circuits (e.g., circuit A and circuit B may comprise or otherwise share the same processor, which, in some example implementations, may execute instructions stored, or otherwise accessed, via different areas of memory). Alternatively or additionally, the one or more processors may be structured to perform or otherwise execute certain operations independent of one or more co-processors.

In other example implementations, two or more processors may be coupled via a bus to enable independent, parallel, pipelined, or multi-threaded instruction execution. Each processor may be implemented as one or more general-purpose processors, ASICs, FPGAs, GPUs, TPUs, digital signal processors (DSPs), or other suitable electronic data processing components structured to execute instructions provided by memory. The one or more processors may take the form of a single core processor, multi-core processor (e.g., a dual core processor, triple core processor, or quad core processor), microprocessor, etc. In some implementations, the one or more processors may be external to the apparatus, in a non-limiting example, the one or more processors may be a remote processor (e.g., a cloud-based processor). Alternatively or additionally, the one or more processors may be internal or local to the apparatus. In this regard, a given circuit or components thereof may be disposed locally (e.g., as part of a local server, a local computing system) or remotely (e.g., as part of a remote server such as a cloud based server). To that end, a "circuit" as described herein may include components that are distributed across one or more locations.

An exemplary system for implementing the overall system or portions of the implementations might include a general purpose computing devices in the form of computers, including a processing unit, a system memory, and a system bus that couples various system components including the system memory to the processing unit. Each memory device may include non-transient volatile storage media, non-volatile storage media, non-transitory storage media (e.g., one or more volatile or non-volatile memories), etc. In some implementations, the non-volatile media may take the form of ROM, flash memory (e.g., flash memory such as NAND, 3D NAND, NOR, 3D NOR), EEPROM, MRAM, magnetic storage, hard discs, optical discs, etc. In other implementations, the volatile storage media may take the form of RAM, TRAM, ZRAM, etc. Combinations of the above are also included within the scope of machine-readable media. In this regard, machine-executable instructions comprise, in a non-limiting example, instructions and data, which cause a general-purpose computer, special purpose computer, or special purpose processing machines to perform a certain function or group of functions. Each respective memory device may be operable to maintain or otherwise store information relating to the operations performed by one or more associated circuits, including processor instructions and related data (e.g., database components, object code components, script components), in accordance with the example implementations described herein.

It should also be noted that the term "input devices," as described herein, may include any type of input device including, but not limited to, a keyboard, a keypad, a mouse, joystick, or other input devices performing a similar function. Comparatively, the term "output device," as described herein, may include any type of output device including, but not limited to, a computer monitor, printer, facsimile machine, or other output devices performing a similar function.

It should be noted that although the diagrams herein may show a specific order and composition of method steps, it is understood that the order of these steps may differ from what is depicted. In a non-limiting example, two or more steps may be performed concurrently or with partial concurrence. Also, some method steps that are performed as discrete steps may be combined, steps being performed as a combined step may be separated into discrete steps, the sequence of certain processes may be reversed or otherwise varied, and the nature or number of discrete processes may be altered or varied. The order or sequence of any element or apparatus may be varied or substituted according to alternative implementations. Accordingly, all such modifications are intended to be included within the scope of the present disclosure as defined in the appended claims. Such variations will depend on the machine-readable media and hardware systems chosen and on designer choice. It is understood that all such variations are within the scope of the disclosure. Likewise, software and web implementations of the present disclosure could be accomplished with standard programming techniques with rule-based logic and other logic to accomplish the various database searching steps, correlation steps, comparison steps, and decision steps.

While this specification contains many specific implementation details, these should not be construed as limitations on the scope of any inventions or of what may be claimed, but rather as descriptions of features specific to particular implementations of the systems and methods described herein. Certain features that are described in this specification in the context of separate implementations may also be implemented in combination in a single implementation. Conversely, various features that are described in the context of a single implementation may also be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements, and features discussed only in connection with one implementation are not intended to be excluded from a similar role in other implementations.

The phraseology and terminology used herein is for the purpose of description and should not be regarded as limiting. The use of "including," "comprising," "having," "containing," "involving," "characterized by," "characterized in that," and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act, or element may include implementations where the act or element is based at least in part on any information, act, or element.

Any implementation disclosed herein may be combined with any other implementation, and references to "an implementation," "some implementations," "an alternate implementation," "various implementation," "one implementation," or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The foregoing description of implementations has been presented for purposes of illustration and description. It is not intended to be exhaustive or to limit the disclosure to the precise form disclosed, and modifications and variations are possible in light of the above teachings or may be acquired from this disclosure. The implementations were chosen and described in order to explain the principals of the disclosure and its practical application to enable one skilled in the art to utilize the various implementations and with various modifications as are suited to the particular use contemplated. Other substitutions, modifications, changes, and omissions may be made in the design, operating conditions and implementation of the implementations without departing from the scope of the present disclosure as expressed in the appended claims.

What is claimed is:

1. A method of removing interference in magnetic resonance (MR) systems, comprising:
   receiving, by one or more processors, first signal data for an MR scan captured using a first coil of an MR system and second signal data captured using a second coil of the MR system;
   generating, by the one or more processors, a filter based at least on the first signal data and the second signal data; and
   generating, by the one or more processors, filtered signal data using the filter, the first signal data, and the second signal data, wherein the filter comprises a Kalman filter, a Kalman smoother, an extended Kalman filter, or an unscented Kalman filter.

2. The method of claim 1, wherein the first coil comprises an imaging coil and the second coil comprises a reference coil.

3. The method of claim 1, wherein the filter comprises one or more transfer functions between the second signal data and the first signal data, as a state of the MR scan over time.

4. The method of claim 1, further comprising determining, by the one or more processors, a state-to-measurement transition matrix based at least on the second signal data.

5. The method of claim 4, wherein generating the filtered signal data comprises subtracting, by the one or more processors, estimated noise from the first signal data, the estimated noise determined using the filter and the state-to-measurement transition matrix.

6. The method of claim 1, wherein generating the filter is further based on an estimated process noise covariance, and an estimated measurement noise covariance.

7. The method of claim 1, wherein generating the filter is further based on noise data generated using a third signal acquired by the MR system without MR signal, a fourth signal acquired by the MR system that has been modified to remove MR signal, or previous MR scan information.

8. A method of removing interference in magnetic resonance (MR) systems, comprising:
   receiving, by one or more processors, first signal data for an MR scan captured using a first coil of an MR system and second signal data captured using a second coil of the MR system;
   generating, by the one or more processors, a filter based at least on the first signal data and the second signal data;
   generating, by the one or more processors, filtered signal data using the filter, the first signal data, and the second signal data; and
   determining, by the one or more processors, a state and a covariance for a current time step of the MR scan based at least on the first and the second signal data.

9. A method of removing interference in magnetic resonance (MR) systems, comprising:
   receiving, by one or more processors, first signal data for an MR scan captured using a first coil of an MR system and second signal data captured using a second coil of the MR system;
   generating, by the one or more processors, a filter based at least on the first signal data and the second signal data; and
   generating, by the one or more processors, filtered signal data using the filter, the first signal data, and the second signal data;
   wherein the first signal data and the second signal data correspond to a first timestep of the MR scan, the method further comprising:
      receiving, by the one or more processors, third signal data for the MR scan captured using the first coil and fourth signal data captured using the second coil, the third signal data and the fourth signal data corresponding to a second timestep of the MR scan, the second timestep occurring before or after the first timestep;
      generating, by the one or more processors, a second filter for the second timestep based at least on the filter, the third signal data, and the fourth signal data; and
      generating, by the one or more processors, second filtered signal data using the second filter, the third signal data, and the fourth signal data.

10. A system of removing interference in magnetic resonance (MR) systems, comprising:
   one or more processors, the one or more processors configured to:
      receive first signal data for an MR scan captured using a first coil of an MR system and second signal data captured using a second coil of the MR system;
      generate a filter based at least on the first signal data and the second signal data; and
      generate filtered signal data using the filter, the first signal data, and the second signal data, wherein the filter comprises a Kalman filter, a Kalman smoother, an extended Kalman filter, or an unscented Kalman filter.

11. The system of claim 10, wherein the first coil comprises an imaging coil and the second coil comprises a reference coil.

12. The system of claim 10, wherein the filter comprises one or more transfer functions between the second signal data and the first signal data, and a state of the MR scan over time.

13. The system of claim 10, wherein the one or more processors are further configured to determine a state and a covariance for a current time step of the MR scan based on the first and the second signal data.

14. The system of claim 10, wherein the one or more processors are further configured to determine a state-to-measurement transition matrix based on the second signal data.

15. The system of claim 14, wherein the one or more processors are further configured to generate the filtered signal data by performing operations comprising subtracting estimated noise from the first signal data, the estimated noise determined using the filter and the state-to-measurement transition matrix.

16. The system of claim 10, wherein the first signal data and the second signal data correspond to a first timestep of the MR scan, the one or more processors further configured to:
    receive third signal data for the MR scan captured using the first coil and fourth signal data captured using the second coil, the third signal data and the fourth signal data corresponding to a second timestep of the MR scan, the second timestep occurring before or after the first timestep;
    generate a second filter for the second timestep based at least on the filter, the third signal data, and the fourth signal data; and
    generate second filtered signal data using the second filter, the third signal data, and the fourth signal data.

17. The system of claim 10, wherein the one or more processors are further configured to generate the filter further based on an estimated process noise covariance and an estimated measurement noise covariance.

18. The system of claim 10, wherein the one or more processors are further configured to generate the filter further based on noise data generated using a third signal acquired by the MR system without MR signal, a fourth signal acquired by the MR system that has been modified to remove MR signal, or previous MR scan information.

19. A method of removing interference in magnetic resonance (MR) systems, comprising:
    generating a model to characterize an imaging channel and a reference channel such that electromagnetic interference (EMI) exists on both the imaging channel and the reference channel, and an MR signal exists only on the imaging channel;
    modeling time-domain impulse response evolving from batch-to-batch with an oth order Kalman filter or smoother; and
    removing modeled EMI from the imaging channel to denoise the MR signal.

* * * * *